(12) United States Patent
Moradi et al.

(10) Patent No.: US 10,803,804 B2
(45) Date of Patent: Oct. 13, 2020

(54) PIXEL CIRCUIT, DISPLAY, AND METHOD

(71) Applicant: Ignis Innovation Inc., Waterloo (CA)

(72) Inventors: Arash Moradi, Waterloo (CA); Jafar Talebzadeh, Waterloo (CA); Junhu He, Waterloo (CA); Hongxin Liu, Cambridge (CA); Shuenn-Jiun Tang, Guelph (CA)

(73) Assignee: Ignis Innovation Inc., Waterloo (CA)

( * ) Notice: Subject to any disclaimer, the term of this patent is extended or adjusted under 35 U.S.C. 154(b) by 0 days.

(21) Appl. No.: 16/162,856

(22) Filed: Oct. 17, 2018

(65) Prior Publication Data

US 2019/0114970 A1    Apr. 18, 2019

Related U.S. Application Data

(60) Provisional application No. 62/573,373, filed on Oct. 17, 2017.

(51) Int. Cl.
| | | |
|---|---|---|
| *G09G 3/3258* | (2016.01) | |
| *H01L 27/12* | (2006.01) | |
| *G09G 3/3291* | (2016.01) | |
| *G09G 3/3266* | (2016.01) | |
| *G09G 3/3233* | (2016.01) | |
| *H01L 27/32* | (2006.01) | |

(52) U.S. Cl.
CPC ......... *G09G 3/3258* (2013.01); *G09G 3/3233* (2013.01); *G09G 3/3266* (2013.01); *G09G 3/3291* (2013.01); *H01L 27/124* (2013.01); *H01L 27/1214* (2013.01); *H01L 27/32* (2013.01); *H01L 27/3248* (2013.01)

(58) Field of Classification Search
CPC .............. G09G 3/32–3291; H01L 27/32–3297
See application file for complete search history.

(56) References Cited

U.S. PATENT DOCUMENTS

| | | | | |
|---|---|---|---|---|
| 7,573,452 | B2 | 8/2009 | Nathan | |
| 7,656,370 | B2 * | 2/2010 | Schneider | G09G 3/3233 345/204 |
| 8,077,123 | B2 * | 12/2011 | Naugler, Jr. | G09G 3/3233 315/169.3 |
| 8,194,063 | B2 * | 6/2012 | Levey | G09G 3/3208 345/211 |
| 8,217,928 | B2 * | 7/2012 | Levey | G09G 3/3233 345/211 |
| 8,558,767 | B2 * | 10/2013 | Kwon | G09G 3/3233 315/169.3 |

(Continued)

FOREIGN PATENT DOCUMENTS

CN           106941135 A  *  7/2011  ........... G09G 3/3208

*Primary Examiner* — Gene W Lee
(74) *Attorney, Agent, or Firm* — Stratford Managers Corporation

(57) ABSTRACT

A pixel circuit for an active matrix organic light emitting diode (AMOLED) and other active matrix displays is disclosed. The pixel circuit is programmed by the voltage supplied through a data line. An electrical current through a light emitting device for a known LED voltage and a pixel current for a pixel programmed with a known data signal can be measured by a readout circuit through the data line. A 7T1C implementation enables to pre-charge the drive transistor to a reference voltage in each drive cycle, and to pre-set the light emitting device to a reference voltage prior to emission in each cycle.

20 Claims, 17 Drawing Sheets

(56) References Cited

U.S. PATENT DOCUMENTS

| | | | | |
|---|---|---|---|---|
| 8,810,556 | B2* | 8/2014 | Lee | G09G 3/3233 |
| | | | | 345/204 |
| 9,953,563 | B2* | 4/2018 | Kishi | G09G 3/3241 |
| 10,147,908 | B2* | 12/2018 | Chen | H01L 51/56 |
| 10,319,305 | B2* | 6/2019 | Kishi | G09G 3/20 |
| 10,431,579 | B2* | 10/2019 | Yang | H01L 27/0266 |
| 10,453,398 | B2* | 10/2019 | Kishi | G09G 3/3233 |
| 2003/0146912 | A1* | 8/2003 | Sung | G09G 3/3233 |
| | | | | 345/212 |
| 2008/0231557 | A1* | 9/2008 | Naugler | G09G 3/3291 |
| | | | | 345/76 |
| 2011/0074762 | A1* | 3/2011 | Shirasaki | G09G 3/3291 |
| | | | | 345/211 |
| 2015/0213757 | A1* | 7/2015 | Takahama | G09G 3/3233 |
| | | | | 345/691 |
| 2017/0193918 | A1* | 7/2017 | Bae | G09G 3/3291 |
| 2018/0211596 | A1* | 7/2018 | Gu | G09G 3/3258 |
| 2019/0130832 | A1* | 5/2019 | Chang | G09G 3/3258 |
| 2019/0288055 | A1* | 9/2019 | Sakai | H01L 27/1255 |
| 2019/0385520 | A1* | 12/2019 | Chen | G09G 3/3233 |

* cited by examiner

PIXEL CIRCUIT, DISPLAY, AND METHOD

CROSS REFERENCE TO RELATED APPLICATIONS

This application claims the benefit of U.S. Provisional Application No. 62/573,373 filed Oct. 17, 2017, which is incorporated herein by reference.

TECHNICAL FIELD

The present disclosure generally relates to electronic displays and components therefor, and in particular to a pixel circuit of an active matrix display, a method for operating the pixel circuit, and a display apparatus using the pixel circuits.

BACKGROUND

An organic light emitting diode (OLED) display, such as an active matrix OLED (AMOLED) display, is generally comprised of an array of organic light emitting diodes (OLEDs), each of which controlled by a dedicated drive transistor. Advantages of AMOLED displays over conventional Liquid Crystal Displays (LCDs) include lower power consumption, manufacturing flexibility, faster refresh rate, larger viewing angles, higher contrast, lighter weight, and amenability to flexible substrates. There is no backlight in an AMOLED display and thus each pixel has different colored OLEDs emitting light independently. The OLEDs emit light based on an electrical current supplied through the drive transistors that are controlled by programming voltages. The electrical power consumed in each pixel relates to the intensity of light generated by that pixel.

The light output of an OLED-based pixel depends on characteristics of the OLED itself and on characteristics of the drive transistor, which is typically a thin film transistor (TFT) that may be fabricated from materials including but not limited to amorphous silicon, polysilicon, or metal oxide. An AMOLED display may be subject to luminance non-uniformity due to variations in the electrical characteristics of the drive transistors, such as the threshold voltage and mobility as the pixels age, and due to a differential aging of the OLEDs. In order to maintain a high image quality, temporal and spatial variation of the pixel circuit parameters should be compensated for, for example by adjusting the programming voltage. In order to do so, relevant circuit parameters may be extracted from the pixel circuit. Measured information can then be used to inform subsequent programming of the pixel circuits so as to ensure that any measured degradation is accounted for by adjustments made to the pixel programming.

SUMMARY

Aspects of the present disclosure relate to a pixel circuit for use in display panels, a display apparatus including such circuits, and a method to drive a pixel circuit of a pixel array in the display apparatus and to perform measurements on the pixel circuit in order to extract parameters of the pixel. The pixel circuit may include a light-emitting device (LED), such as an organic light emitting diode (OLED), and may also include a drive transistor, such as a thin-film transistor (TFT). The present disclosure further provides a method and structure to measure a pixel current and a LED current. The method may include supplying voltage or current to the pixel circuit via a data line and measuring an electric current in the data line. The method may further include converting the measured electrical current to voltage for further processing. According to an aspect of the present disclosure, the display apparatus may include a source driver that connects to the pixel circuits of the display via data lines. The source driver generates pixel programming signals during normal operation of the display, and may further comprise a readout circuit for measuring the current provided by the source driver to the pixel circuit in a measurement mode. The measured current may be converted into a digital code, such as for example a 10 to 16 bit digital code. The digital code may be provided to a digital processor for further processing and for calibrating the pixel programming signals, such as data voltages.

The foregoing and additional aspects and embodiments of the present disclosure will be apparent to those of ordinary skill in the art in view of the detailed description of various embodiments and/or aspects, which is made with reference to the drawings, a brief description of which is provided next.

BRIEF DESCRIPTION OF THE DRAWINGS

Embodiments disclosed herein will be described in greater detail with reference to the accompanying drawings, which are not to scale, in which like elements are indicated with like reference numerals, and wherein.

DETAILED DESCRIPTION

Figure 1:
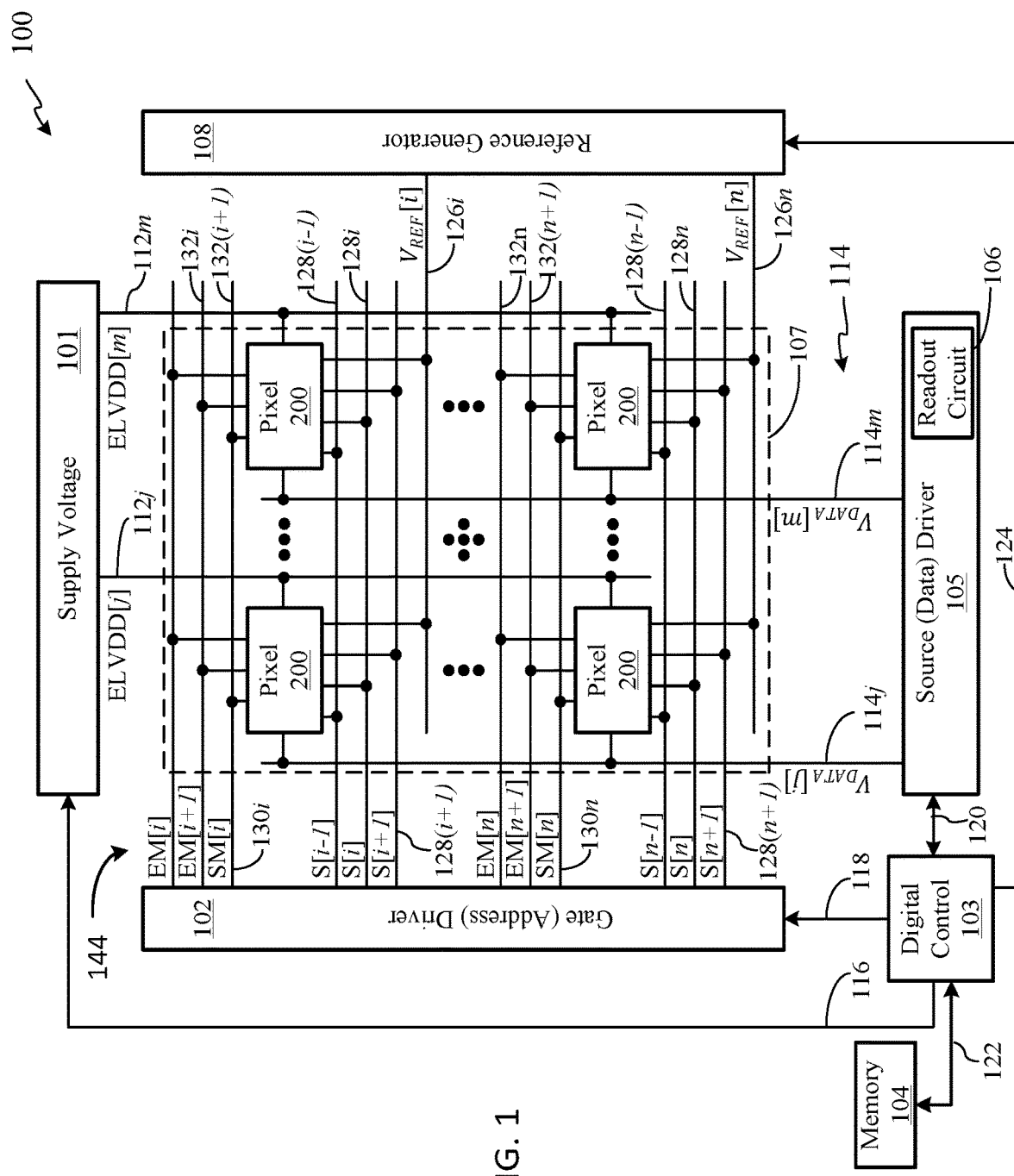
FIG. 1 is a schematic block diagram of an example active matrix display system in accordance with an embodiment.

In the following description, for purposes of explanation and not limitation, specific details are set forth, such as particular circuits, circuit components, techniques, etc. in order to provide a thorough understanding of the present invention. However, it will be apparent to one skilled in the art that the present invention may be practiced in other embodiments that depart from these specific details. In other instances, detailed descriptions of well-known methods, devices, and circuits are omitted so as not to obscure the description of the example embodiments. All statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure. Thus, for example, it will be appreciated by those skilled in the art that block diagrams herein can represent conceptual views of illustrative circuitry embodying the principles of the technology. The functions of the various elements including functional blocks labeled or described as "processors" or "controllers" may be provided through the use of dedicated hardware as well as hardware capable of executing software in association with appropriate software. When provided by a processor, the functions may be provided by a single dedicated processor, by a single shared processor, or by a plurality of individual processors, some of which may be shared or distributed. Moreover, explicit use of the term "processor" or "controller" should not be construed to refer exclusively to hardware capable of executing software, and may include, without limitation, digital signal processor (DSP) hardware, read only memory (ROM) for storing software, random access memory (RAM), and non-volatile storage.

Note that as used herein, the terms "first", "second" and so forth are not intended to imply sequential ordering, but rather are intended to distinguish one element from another, unless explicitly stated. Similarly, sequential ordering of method steps does not imply a sequential order of their execution, unless explicitly stated.

An aspect of the present disclosure provides a pixel circuit for an electronic display configured for operating in a drive mode or in one or more measurement modes. The pixel circuit may comprise a light emitting device (LED) configured to emit light responsive to an electrical drive current flowing through the LED, a drive transistor having a first terminal, a second terminal, and a gate terminal, and configured to control the electrical drive current responsive to a voltage at the gate terminal thereof, and a storage capacitor connected to the gate terminal of the drive transistor. A second transistor may be provided to switchably connect the gate terminal of the drive transistor to the second terminal thereof. The pixel circuit may further include a first switching circuit switchably connecting the first terminal of the drive transistor to a power supply line of the electronic display or to a data line of the electronic display, and a second switching circuit switchably connecting one of the gate terminal of the drive transistor or the LED to a source of a reference voltage.

In example implementations the light emitting device (LED) may be an organic light emitting diode (OLED), which may have an anode terminal and a cathode terminal. In example embodiments described below the anode terminal may be connected to the drive transistor, and the cathode terminal may be connected to a negative power supply terminal, which in some embodiments may be a ground terminal.

In some embodiments the first switching circuit may comprises a third transistor switchably connecting the first terminal of the drive transistor to the power line, and a fourth transistor switchably connecting the first terminal of the drive transistor to the data line.

In some embodiments the second switching circuit may comprise a fifth transistor switchably connecting the gate of the drive transistor to the source of a reference voltage for pre-charging the storage capacitor, and wherein the storage capacitor is connected between the gate terminal of the drive transistor and the power line.

In some embodiments the pixel circuit may comprise a sixth transistor switchably connecting the second terminal of the drive transistor to the light emitting device.

In some embodiments the second switching circuit may further comprise a seventh transistor switchably connecting the light emitting device to the source of the reference voltage for pre-setting the OLED.

In some embodiments the drive transistor, the second transistor, the first switching circuit, and the second switching circuit may comprise each a p-type transistor, for example a p-type thin-film transistor (TFT).

An aspect of the present disclosure provides a method for operating a pixel array of a display comprising a plurality of pixel circuits, each pixel circuit comprising a LED, a drive transistor comprising a gate, a first terminal, and a second terminal, and a storage capacitor connected to the gate. The method may comprise operating a pixel circuit of the pixel array in a drive mode comprising a programming stage and an emission stage, and in a LED measurement mode comprising a pre-charging stage and a measuring stage. The programming stage of the drive mode may comprise temporally activating electrical connections between the second terminal of the drive transistor and the gate of the drive transistor and between the first terminal of the drive transistor and a data line of the display so as to charge the gate of the drive transistor with a data line voltage offset by a threshold voltage of the drive transistor. The emission stage of the drive mode may comprise temporally activating an electrical connection between the first terminal of the drive transistor and a power supply line while providing an electrical connection between the second terminal of the drive transistor and the LED so as to drive the LED with an electrical drive current responsive to the data line voltage.

The pre-charging stage of the LED measurement mode may comprise applying a reference voltage to the gate of the drive transistor to shift the drive transistor into a triode mode wherein the drive transistor operates as a switch in an ON state. The measuring stage of the LED measurement mode may comprise at least temporally providing electrical connections between the second terminal of the drive transistor and the LED and between the first terminal of the drive transistor and the data line so as to enable an electrical current to flow between the data line and the LED, and measuring the electrical current in the data line.

The method may further comprise operating the pixel array in a pixel measurement mode. The pixel measurement mode may comprise: temporally activating the electrical connections between the second terminal of the drive transistor and the gate of the drive transistor and between the first terminal of the drive transistor and the data line so as to pre-charge the gate of the drive transistor with the data line voltage offset by the threshold voltage of the drive transistor; activating the electrical connections between the second terminal of the drive transistor and the LED and between the first terminal of the drive transistor and the data line so as to enable an electrical current to flow between the drive transistor and the data line; and measuring the electrical current flowing in the data line while biasing the first terminal of the drive transistor with a pre-defined bias voltage through the data line.

The pixel circuit may be configured for operating a pixel in an i-th row or column of the pixel array, wherein i is an integer, and the method may comprise: a) using a scan signal S[i] of the i-th row or column of the pixel array to activate or deactivate the electrical connection between the data line and the gate of the drive transistor, b) using a programming signal SM[i] of the i-th row or column of the pixel array to activate or deactivate the electrical connection between the gate of the drive transistor and the second terminal of the drive transistor, c) using an emission signal EM[i] of the i-the row or column of the pixel array to activate or deactivate the electrical connection between the second terminal of the drive transistor and the LED, d) using an emission signal EM[i+1] of a next adjacent row or column of the pixel array to activate or deactivate the electrical connection between the first terminal of the drive transistor and the power supply terminal, e) using a scan signal S[i−1] of a preceding adjacent row or column of the pixel array to activate or deactivate an electrical connection between the gate of the drive transistor and a source of a reference voltage, and f) using a scan signal S[i+1] of the next adjacent row or column of the pixel array to activate or deactivate an electrical connection between an LED terminal and the source of a reference voltage.

In some implementations operating the pixel circuit in the drive mode may further comprise temporally activating an electrical connection between the gate of the drive transistor and the source of a reference voltage prior to the programming stage for pre-charging the storage capacitor.

In some implementations the method may further comprise at least temporally activating the electrical connection between the LED and the source of a reference voltage after the measuring stage.

In some implementations the method may further comprise activating the electrical connection between the LED and the source of a reference voltage at the end of the pixel measurement mode.

In some implementations the first terminal of the drive transistor may be disconnected from the power supply line in the programming stage, and may be disconnected from the data line in the emission stage. The first terminal of the drive transistor may be disconnected from both the power supply line and the data line in the pre-charging stage.

An aspect of the present disclosure provides a display apparatus adapted for pixel measurements, comprising: a pixel array comprising a plurality of pixel circuits, each pixel circuit comprising a LED, a drive transistor for providing electrical drive current to the LED, and a storage capacitor. The display apparatus may further comprise a source driver circuit comprising a source driver and a plurality of data lines connecting the source driver to the pixel circuits. The source driver may comprise a readout circuit (ROC) configured to selectively measure an electrical current in the data lines. The display apparatus may further comprise a gate driver circuit comprising a gate driver and a plurality of control lines connecting the source driver to the pixel circuits. The display apparatus may further comprise a reference voltage circuit comprising a reference voltage source and a plurality of reference voltage lines for providing a reference voltage to the pixel circuit. The display apparatus may further comprise a power supply circuit comprising a power supply source and a plurality of power supply lines for providing electrical power to the pixel circuits; and, a controller operatively coupled to the source driver, the gate driver, and the reference generator, and configured for controlling electrical signals generated by the gate driver.

The drive transistor of each pixel circuit may comprise a first terminal, a second terminal, and a gate. The storage capacitor may be connected between the gate and one of the power supply lines.

Each pixel circuit may further comprise a plurality of switching transistors, each of which controlled by a gate control signal from the gate driver, for controllably connecting the first terminal of the drive transistor to the power line or to one of the data lines, the second terminal of the drive transistor to the gate of the drive transistor or to the LED, and one of the reference voltage lines to the gate of the drive transistor or the LED.

The controller may be configured to operate the pixel array in a drive mode wherein the source driver supplies data signals to the pixel circuits in synchronization with the gate control signals from the gate driver. The controller may be further configured to operate the pixel array in an LED measurement mode, which may comprise a pre-charging stage and a measuring stage, wherein in the pre-charging stage the reference voltage source provides a reference voltage Vref to the gate of the drive transistor of a selected pixel circuit so that the drive transistor is shifted to a triode mode providing an electrical connection between the first terminal and the second terminal of the drive transistor, and in the measuring stage of the LED measurement mode the second terminal of the drive transistor is connected to the LED and the first terminal of the drive transistor is connected to the data line so as to provide a bias voltage $V_B$ to the LED from the data line and to allow an electrical current to flow between the ROC and the LED through the data line for being measured by the ROC.

The controller may be configured to operate the pixel array in a pixel measurement mode comprising a programming stage and a measuring stage, wherein in the programming stage the gate driver activates, for a selected pixel circuit, electrical connections between the second terminal of the drive transistor and the gate of the drive transistor and between the first terminal of the drive transistor and a data line so as to pre-charge the gate with the data line voltage offset by a threshold voltage of the drive transistor, and wherein in the measuring stage the gate driver activates, for the selected pixel circuit, the electrical connections between the second terminal of the drive transistor and the LED and between the first terminal of the drive transistor and the data line so as to enable an electrical current to flow between the data line and the LED, and the ROC measures the electrical current flowing in the data line while biasing the first terminal of the drive transistor with a pre-define bias voltage through the data line.

In some embodiments the pixel array comprises a plurality of pixel rows, and the plurality of control lines comprises: a plurality of scan lines for delivering scan signals S[i] to the pixel circuits of each pixel row, a plurality of programming control lines for delivering programming signals SM[i] to the pixel circuits of each pixel row, and a plurality of emission control lines for delivering emission signals EM[i] to the pixel circuits of each pixel row.

In some embodiments at least some of the scan lines may be connected to three adjacent pixel rows each. In some embodiments at least some of the scan lines may be connected to three adjacent pixel rows each.

In some embodiments the controller may be configured to control the source of a reference voltage so as to provide to the pixel circuit a first reference voltage in the drive mode and a second reference voltage in the LED measuring mode.

One or more aspects of the present disclosure relate to a display apparatus including a pixel array wherein individual pixels include an organic light-emitting diode (OLED), or generally some other suitable light emitting device (LED), and a drive transistor for controlling an electrical drive current through the LED or OLED to control its emission. Thus each pixel of the display has a pixel circuit associated therewith, which in operation may be programmed through a data line to emit a desired amount of light during each frame period. Pixels of color displays may each include three or more pixel circuits, each with an associated OLED of a corresponding color; accordingly, features and principle described hereinbelow with reference to example pixel circuits may relate to pixel circuits associated with a LED or an OLED of any color in an active matrix display, such as for example an AMOLED display.

FIG. 1 is a block diagram of an electronic display system 100. The display system 100, which may also be referred to as a display apparatus, is an embodiment of an electronic display that includes a gate (address) driver 102, a source (data) driver 105, a digital controller 103, a reference generator 108, a power supply source in the form of a supply voltage block 101, and a display panel 107. The reference generator 108 may also be referred to herein as the source of a reference voltage 108. The display system 100 may also include a memory storage 104 coupled to the controller 103. The display panel 107 includes a plurality of pixel circuits 200 arranged in "N" rows and "M" columns, which may be disposed at intersections of control lines 144 extending from the gate driver 102, and data lines 114 extending from the source driver 105. The source driver 105, which may also be referred to as a data driver, may include a Readout Circuit (ROC) 106. Power supply lines 112 extending from the supply voltage source 101 provide electrical power to the pixels circuits 200. The gate driver 102 with the plurality of control lines 144 connected thereto may also be referred to herein as the gate driver circuit, while the source driver 105 with the plurality of data lines 114 connected thereto may be referred to herein as the source circuit or the data circuit. The power supply source 101 together with the power supply lines 112 connected thereto may be referred to herein as the power supply circuit. The controller 103 may control the gate driver 102 and the source driver 105 to operate either in a drive mode or in one or more measurement modes, as described hereinbelow.

Each pixel circuit 200 may include a drive transistor, a storage capacitor, and a light emitting device (LED) such as a light emitting diode. Thus, the display panel 107 may be referred to as an active matrix display array. In example embodiments described herein the light emitting device is an OLED, but could be a different type of LED. In at least some embodiments each pixel circuit 200 may include several transistors, such as for example, but nor exclusively, Thin-Film Transistors (TFTs). An example embodiment described hereinbelow, for example with reference to FIG. 5, may include seven transistors, for example seven TFT transistors.

In at least some embodiments the reference generator 108 may provide a constant or adjustable reference voltage $V_{REF}$ for the pixel circuits 200 of the display panel 107 by means of a plurality of reference lines, which in FIG. 1 are represented by two reference lines 126i and 126n, and which may be generally referred to herein as reference lines 126. In some embodiment the reference generator 108, which may be also referred to as the reference voltage source 108, may be controlled by signals 124 from the controller 103. Using these signals the controller 103 may adjust the reference voltage $V_{REF}$, for example in dependence on a mode or stage of operation as described hereinbelow. In some embodiments the same value of the reference voltage $V_{REF}$ may be provided to each pixel circuit 200 that currently operate in a same state. The reference voltage source 108 with the plurality of reference lines 126 connected thereto may be referred to as the reference circuit.

Each pixel circuit 200 may be individually programmed with data signals generated by the source driver 105, so as to emit light with luminance defined by the data signals. In operation the controller 103 may receive digital video data indicative of information to be displayed on the display panel 107. The controller 103 may then send signals 120 comprising digital video data to the source driver 105 and signals 118 to the gate (address) driver 102 to select the pixel circuits 200 in the display panel 107 on row by row basis and to program pixel circuits 200 to display the video information comprised in the video data. A supply voltage block 101 provides constant or adjustable electrical power for the display panel 107; in some embodiments it may be controlled by signals 116 from the controller 103. The supply voltage block 101, which may also be referred to herein as the power supply source, provides supply voltage to the pixel circuits 200 through a plurality of power supply lines. These power supply lines, which are represented in FIG. 1 by power supply lines 112j and 112m, may be generally referred to herein as power supply lines 112. The plurality of power supply lines 112 together with the supply voltage block 101 may be referred to as a power supply circuit of the display panel 107.

The plurality of pixel circuits 200 associated with the display panel 107 thus comprises a pixel array of the display ("display screen") adapted to dynamically display information according to the input digital data received by the controller 103. The display panel 107 can display, for example, video information from a stream of video data received by the controller 103.

For the sake of clarity, the display system 100 in FIG. 1 is illustrated with only four pixel circuits 200 in the display panel 107, which are located at the intersections of the i-th and n-th rows and the j-th and m-th columns of the pixel array. The display system 100 can however be implemented with a plurality of pixel circuits that are same or similar as pixel circuits 200, and the size of the pixel array of the display panel 107 is not restricted to a particular number of rows and columns of pixels. For example, the display system 100 can be implemented with a number of rows and columns of pixels commonly in the display panel 107 that are available in displays for mobile devices, monitor-based devices, TVs and projection devices.

As illustrated in FIG. 1 by way of example, the top-left pixel circuit 200 represents a pixel circuit located in the "i-th" row and "j-th" column of the pixel array of the display panel 107, which may be denoted as the [i,j] position in the pixel array. The top-right pixel circuit 200 represents a pixel circuit located in the "i-th" row and "m-th" column of the pixel array of the display, i.e. at the [i, m] position in the pixel array. The bottom-left pixel circuit 200 represents a pixel circuit located in the "n-th" row and "j-th" column of the pixel array of the display, i.e. at the [n, j] position in the pixel array. The bottom-right pixel circuit 200 represents a pixel circuit located in the "n-th" row and "m-th" column of the pixel array of the display, i.e. at the [n, m] position in the pixel array. It will be appreciated that i and j may stand for any integer from 1 to n, and from 1 to m, respectively, and n and m may stand for any integer from (i+1) to N, and from (j+1) to M, respectively.

In some embodiments the gate driver 102 may be programmed to generate control signals such as emission control signals EM[k], scan signals S[k], and programming control signals SM[k], where an integer index k=0, . . . , N may be viewed as an array row index or counter; here N≥n denotes the number of rows in the pixel array. In some embodiments these control signals may be delivered to the pixel circuits row by row. The control lines 144 may include a plurality of scan lines for delivering the scan signals S[k], a plurality of emission control lines for delivering the emission control signal EM[k], and a plurality of programming control lines for delivering the programming control signals SM[k]. The scan lines are represented in FIG. 1 by a scan line 128(i−1) of the (i−1)st row, a scan line 128i of the i-th row, and a scan line 128(i+1) of the (i+1) row, a scan line 128(n−1) of the (n−1)st row, a scan line 128n of the n-th row, and a scan line 128(n+1) of the (n+1) row, and may be generally referred to herein as the scan lines 128. The plurality of emission control lines are represented in FIG. 1 by an emission control line 132i of the i-th row, an emission control line 132(i+1) of the (i+1)th row, an emission control line 132n of the n-th row, and an emission control line 132(n+1) of the (n+1)th row, and may be generally referred to herein as the emission control lines 132. The plurality of programming control lines are represented in FIG. 1 by a programming control line 130i of the i-th row and a programming control line 130n of the n-th row, and may be generally referred to herein as the programming control lines 132.

In some embodiments at least some of the scan lines 128 may be connected to three adjacent pixel rows each, as illustrated in FIG. 1. In some embodiments at least some of the emission control lines 132 may be connected to two adjacent pixel rows each, as illustrated in FIG. 1. Scan lines 128 for delivering scan signals S[k] may also be referred to as S[k] signal lines, emission control lines 132 for delivering the emission control signal EM[k] may also be referred to as EM[k] signal lines, and the programming control lines 130 for delivering the programming control signals SM[k] may also be referred to as SM[k] signal lines; here k may be any integer from 0 to N; in FIG. 1, pixel rows with k=1 and k=n are illustrated by way of example.

As illustrated in FIG. 1, the top-left pixel circuit 200, which represents a pixel located at the [i,j] position in the pixel array of the display panel 107, is coupled to EM[i] signal line 132i, EM[i+1] signal line 132(i+1), SM[i] signal line 130i, S[i−1] signal line 128(i−1), S[i] signal line 128i, S[i+1] signal line 128(i+1), a supply line (ELVDD[j]) 112j, a data line ($V_{DATA}$[j]) 114j, and a reference line ($V_{REF}$[i]) 126i. The top-right pixel 200, which is located at the (i,m) position in the pixel array of the display panel 107, is coupled to EM[i] signal line 132i, EM[i+/] signal line 132(i+1), SM[i] signal line 130i, S[i−1] signal line 128(i−1), S[i] signal line 128i, S[i+1] signal line 128(i+1), a supply line (ELVDD[m]) 112m, a data line ($V_{DATA}$[m]) 114m, and a reference line ($V_{REF}$[i]) 126i. The bottom-left pixel 200 in the display panel 107, which is located at the (n,j) position in the pixel array of the display panel 107, is coupled to EM[n] signal line 132n, EM[n+2] signal line 132(n+1), SM[n] signal line 130n, S[n−1] signal line 128(n−1), S[n] signal line 128n, S[n+1] signal line 128(n+1), a supply line (ELVDD[j]) 112j, a data line ($V_{DATA}$[j]) 114j, and a reference line ($V_{REF}$[n]) 126n. The bottom-right pixel 200, which is located at the (n,m) position in the pixel array of the display panel 107, is coupled to EM[n] signal line 132n, EM[n+1] signal line 132(n+1), SM[n] signal line 130n, S[n−1] signal line 128(n−1), S[n] signal line 128n, S[n+1] signal line 128(n+1), a supply line (ELVDD[m]) 112m, a data line ($V_{DATA}$[m]) 114m, and a reference line ($V_{REF}$[n]) 126n.

Each pixel circuit 200 may include one or more switches, and may be operated in a plurality of states, each defined by the states of the constituent switches. In some embodiments these switches may be in the form of transistors, such as TFT transistors, and may be switched between an ON state, in which they allow an electrical current to pass through, and an OFF state, in which they substantially block the current and break an electrical connection in the circuit. Switching a transistor "ON" effectively activates an electrical connection through it. The switching may be accomplished by applying an "ON" voltage or an "OFF" voltage to a gate of the switching transistor. In some embodiments, the switches may be controlled by current. The control signals S[ ], EM[ ], and SM[ ], which are generated by the gate (address) driver 102, carry the desired ON or OFF voltages or currents to the gates of the respective switching transistors, thereby controlling the state of each pixel circuit 200 in the display panel 107. In some embodiments these control signals enable using the data lines 114 both for programming the pixel circuits 200 in accordance with the video signal from the controller 103 during normal operation of the display, and for measuring pixel or OLED currents in a measurement mode or modes, as described hereinbelow with reference to specific embodiments.

A data line 114 conveys programming information, such as a programming voltage $V_{DATA}$ or a programming current, from the source driver 105 to the pixel circuits 200 connected to it in order to program the pixel circuits 200 to emit a desired amount of luminance according to the digital data received by the controller 103. A programming voltage $V_{DATA}$ (or programming current) may be applied to a pixel circuit 200 during a programming operation of the pixel circuit 200 so as to charge a storage device within the pixel circuit 200, such as a storage capacitor, thereby enabling the OLED in the pixel circuit 200 to emit light with the desired amount of luminance during an emission operation following the programming operation. For example, the storage device in the pixel circuit 200 can be charged during a programming operation to apply a voltage to a terminal of the drive transistor during the emission operation, thereby causing the drive transistor to convey a drive current through the light emitting device according to the voltage stored on the storage device. The drive current that is conveyed through the light emitting device by the drive transistor during the emission operation of the pixel circuit 200 is supplied by the supply voltage block 101 via a power supply line 112, such as the power supply lines 112j and 112m in FIG. 1. The power supply lines 112 may provide, for example, a positive supply voltage to each pixel circuit 200, such as a voltage that is commonly denoted in circuit design as "ELVDD".

The display system 100 may also include a Readout Circuit (ROC) 106, which in some embodiments may be integrated with the source driver 105. ROC 106 may be configured to perform measurements on a selected pixel circuit or circuits through a data line 114 connected thereto. Referring by way of example to the top left pixel circuit 200 of the display panel 107 shown in FIG. 1, it may be connected to ROC 106 through the data line 114j. The data line 114j allows ROC 106 to measure a current associated with the pixel circuit 200 connected to the data line, and hereby extract information indicative of a degradation of the pixel circuit 200. In some embodiments ROC 106 may convert the measured current to a corresponding voltage. This current or voltage may then be converted into a digital code, for example a 10 to 16 bit digital code, which may be then sent to the digital controller 103 for further processing. Controller 103 may be configured to use the pixel degradation information contained in the measured current to compensate for that degradation during normal operation of the display, for example when displaying a video.

Figure 2:
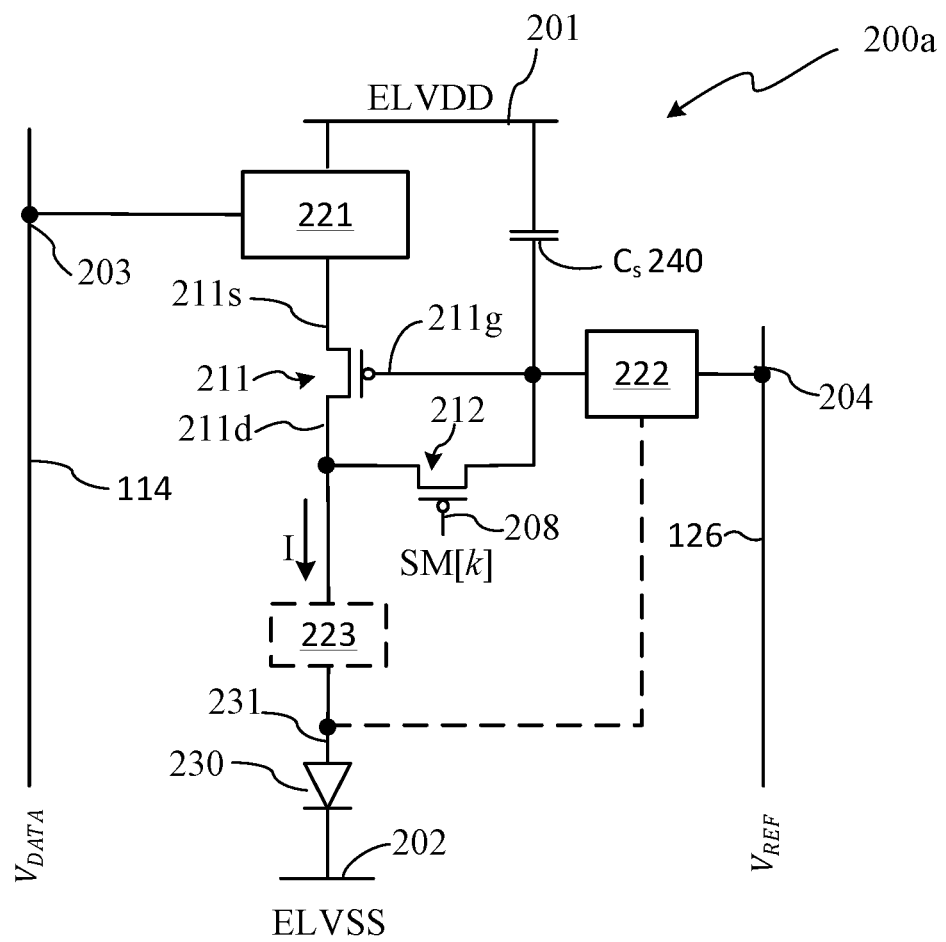
FIG. 2 is a schematic block diagram of a pixel circuit with a switchable connection to a reference voltage source.

Referring to FIG. 2, there is schematically illustrated a circuit diagram of a pixel circuit 200a in accordance with an aspect of the present disclosure. The pixel circuit 200a may be an embodiment of the pixel circuit 200 of the display system 100. The pixel circuit 200a illustrated in FIG. 2 is configured so that is may operate in a drive mode and in one or more measurement modes. It includes a data terminal 203 for connecting to a data line, such as for example one of the data lines 114 of the display system 100, a power terminal 201 for connecting to a power supply source, and a reference voltage terminal 204 for connecting to a source of reference voltage, for example to a reference voltage line 126. The pixel circuit 200a further includes a light emitting device 230 that is configured to emit light responsive to an electrical drive current flowing therethrough. In example embodiments described herein the light emitting device 230 is an OLED, with the electrical drive current I through it referred also simply as the drive current. A drive transistor 211 is electrically coupled between the power terminal 201 and the OLED 230. The drive transistor 211 has a first terminal 211s, a second terminal 211d, and a gate terminal 211g, and is configured to control the drive current I responsive to a voltage at the gate 211g thereof. In the following the first terminal 211s of the drive transistor may also be referred to as the source terminal, while the second terminal 211d may also be referred to as the drain terminal, although the "source" and "drain" designations may be somewhat arbitrary and are not meant as limitations. The pixel circuit 200a further includes a storage capacitor Cs 240 connected to the gate 211g of the drive transistor, for charging the gate 211g of the drive transistor 211 to a desired voltage in a pixel programming stage, as described hereinbelow. In the illustrated embodiment the storage capacitor 240 is electrically connected between the gate 211g of the drive transistor and the power terminal 201 (ELVDD).

The OLED 230 has a first OLED terminal or node 231 for receiving the electrical drive current I from the drive transistor 211, and a second OLED terminal for connecting to a second power supply terminal 202, denoted "ELVSS". In some embodiments ELVDD may correspond to a higher, i.e. more positive, voltage than ELVSS, and the second power supply terminal 202 may be referred to as the negative power supply terminal; in such embodiments the first OLED terminal or node 231 may be an anode terminal of the OLED 230, with the cathode terminal of the OLED 230 connected to the negative power supply terminal 202 (ELVSS). In some embodiments ELVSS may correspond to the lowest voltage in the pixel circuit, and ELVDD—the highest, i.e. most positive, voltage in the pixel circuit. In some embodiment the negative power supply terminal 202 may be the ground terminal.

The pixel circuit 200a further includes a plurality of switches, which in operation may be controlled by the control signals such as the control signals 144 of the display system 100 to switch the pixel circuit 200a between different states. In at least some embodiments these switches may be in the form of, or include, transistors, such as but not exclusively TFT transistors. In the illustrated embodiment the pixel circuit 200a includes a first switching circuit 221, a second switching circuit 222, and a second transistor 212 operating as a switch. In some embodiments the pixel circuit 200a may further include a third switching circuit or element 223 connected between the drain 211d of the drive transistor 211 and the OLED terminal or node 231. The second transistor switch 212 may be referred to herein as the second transistor 212 or simply as transistor 212. The second transistor 212 may be switchable by a control signal 208 between an "ON" and "OFF" states. In the "ON" state, transistor 212 electrically connects the gate 211g to the drain 211d of the drive transistor 211, and disconnects the gate 211g from the drain 211d in the "OFF" state. The first switching circuit 221 is configured to switchably connect the source 211s of the drive transistor 211 to either the power terminal 201 or the data terminal 203. The second switching circuit 222 is configured to switchably connect the reference voltage terminal 204 to the gate 211g of the drive transistor 211 for pre-charging the storage capacitor 240 and the gate 211g to a reference voltage. In some embodiments the second switching circuit 222 may be configured to switchably connect the reference voltage terminal 204 either to the gate 211g of the drive transistor 211 for pre-charging the storage capacitor 240, for example in an OLED measurement mode as described below, or to the OLED terminal or node 231, for example for pre-setting the voltage at the OLED terminal or node 231 in a pixel measurement mode and/or a drive mode.

Figure 3:
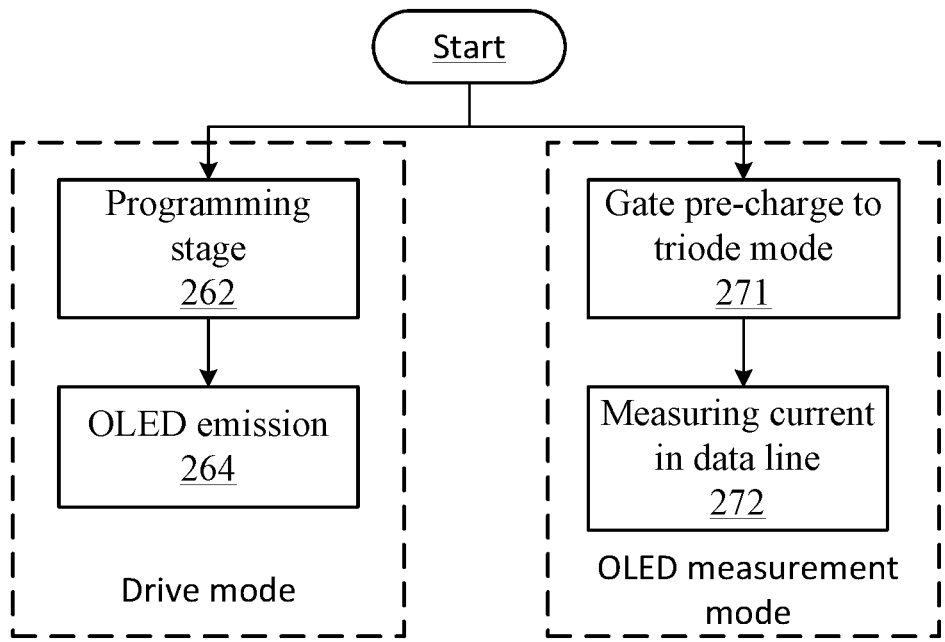
FIG. 3 is a flowchart of a method of operating the pixel circuit of FIG. 2 in a drive mode and in a LED measurement mode.
Figure 4:
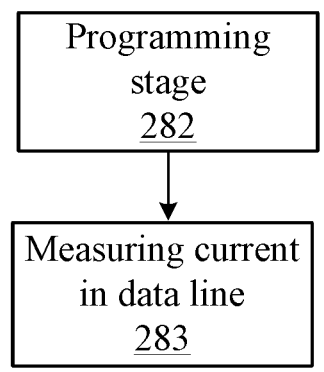
FIG. 4 is a flowchart of a method of operating the pixel circuit of FIG. 2 in a pixel measurement mode.

Referring now also to FIGS. 3 and 4, in some embodiments the pixel circuit 200a may be operated in a drive mode or in measurement mode, such as an OLED measurement mode or a pixel measurement mode. The drive mode of operation may include a programming stage 262 and an emission stage 264. The OLED measuring mode may include a pre-charge stage 271 and a measuring stage 272. The OLED measuring mode may also be referred to herein as the LED measurement mode.

Referring first to FIG. 3, in the drive mode the pixel circuit 200a is operated to emit light in accordance with a data signal from the display's controller; thus the drive mode may be viewed as a part of normal operation of the display to present images. The programming stage 262 of the drive mode may include temporally activating electrical connections between the drain 211d and the gate 211g of the drive transistor 211, for example by switching transistor 212 to its "ON" state, and between the source 211s of the drive transistor 211 and the data line terminal 203 using the first switching circuit 221. This may charge the storage capacitor 240 and the gate 211g of the drive transistor 211 with a data line voltage $V_{DATA}$ offset by a threshold voltage $V_{TH}$ of the drive transistor 211, so as to pre-compensate for a contribution of the threshold voltage $V_{TH}$ in the source-drain current of the drive transistor 211 at the emission stage 264.

The emission stage 264 may include temporally activating an electrical connection between the source 211s of the drive transistor 211 and the power terminal 201, for example using the first switching circuit 221. The electrical connection between the gate 211g and the drain 211d of the drive transistor 211 may be deactivated at the emission stage 264. In the emission stage, the OLED 230 is electrically connected to ELVDD through the drive transistor 211, thereby enabling an electrical current to flow to the OLED 230 in accordance with the data line voltage $V_{DATA}$.

In the OLED measurement mode, an electrical current to the OLED 230 in dependence on voltage may be measured to determine deterioration in relevant OLED characteristics. The pre-charging stage 271 of the OLED measurement mode may include applying a reference voltage $V_{REF}$ to the gate 211g of the drive transistor 211 to shift the drive transistor 211 into a triode mode, wherein the drive transistor 211 operates as a switch in an ON state. The OLED measuring stage 272 may include temporally activating an electrical connection between the source 211s of the drive transistor 211 and the data line 114, so as to enable an electrical current to flow between the data line 114 and the OLED 230. The OLED measuring stage 272 may also include providing an electrical connection between the drain 211d of the drive transistor 211 and the OLED 230, for example by activating the connection with the third switching circuit or element 223. Once the electrical connection between the data line 114 and the OLED 230 is established, a known bias voltage $V_B$ may be provided to the OLED through the data line 114, and the electrical current that flows between the OLED 230 and the data terminal 203, and thus in the data line 114, in response to that voltage may be measured by ROC 106. At the OLED measuring stage 272 the drive transistor 211 remains in the triode mode. In the triode mode, the source-drain current is approximately proportional to the source-drain voltage. Furthermore in the triode mode the source-drain resistance of the drive transistor 211 may be suitably small, so that a voltage drop between the data terminal 203 and the OLED terminal 231 may be either neglected or calibrated out. By way of example, in some embodiments the source-drain resistance of the drive transistor 211 in the triode mode may be a fraction of one Volt or less.

Referring to FIG. 4, the pixel circuit 200a may also be operated in a pixel measurement mode, which may be used to measure electrical current through the pixel when the drive transistor is programmed with a known data voltage $V_{DATA}$, emulating the drive mode. In the illustrated embodiment the process of the pixel measurement includes a programming stage 282 which is generally similar to the programming stage 262 of the drive mode, and a current measuring stage that is generally similar to the measuring stage 272 of the OLED measuring mode described hereinabove with reference to FIG. 3. The programming stage 282 of the pixel measurement mode may include temporally activating the electrical connections between the drain 211d and the gate 211g of the drive transistor 211, for example by switching transistor 212 to its "ON" state, and between the source 211s of the drive transistor 211 and the data line terminal 203 using the first switching circuit 221. This may charge the gate 211g of the drive transistor 211 with a data line voltage, e.g. $V_{DATA}$, offset by the threshold voltage $V_{TH}$ of the drive transistor 211, so as to pre-compensate for the contribution of the threshold voltage $V_{TH}$ in the source-drain current of the drive transistor 211 at the measuring stage 283.

The measuring stage 283 may include temporally activating an electrical connection between the source 211s of the drive transistor 211 and the data line 114 so as to enable an electrical current to flow between the data line 114 and the OLED 230 through the drive transistor 211. The measuring stage 283 may also include providing an electrical connection between the drain 211d of the drive transistor 211 and the OLED 230, for example by activating the connection with the third switching circuit or element 223. Once the electrical connection between the data line 114 and the OLED 230 is established, an electrical current that flows between the OLED 230 and the data terminal 203, and thus in the data line 114, may be measured by ROC 106.

Figure 5:
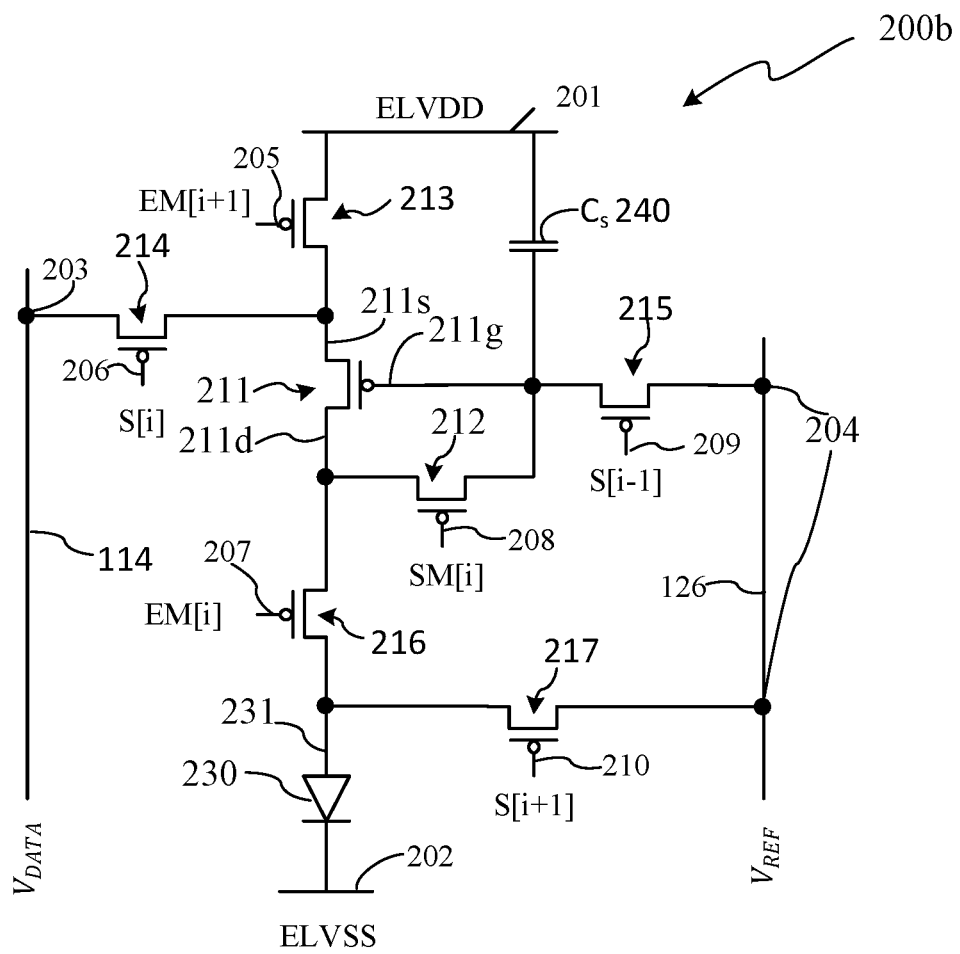
FIG. 5 is a schematic circuit diagram of an example "7T1C" pixel circuit with a switchable connection to a reference voltage source.

Turning now to FIG. 5, there is illustrated an embodiment 200b of the pixel circuit 200a of FIG. 2. The pixel circuit 200b can be used in place of the pixel circuits 200 in the display apparatus 100 of FIG. 1. Elements shown in FIG. 5 that are same or similar to corresponding elements shown in FIG. 2 are indicated with same reference numerals and may not be described here again. The pixel circuit 200b includes seven transistors 211-217, a storage capacitor 240 ($C_S$), and an OLED 230. Each of the transistors 211-217 may be implemented as a TFT, for example. Thus the pixel circuit 200b is formed of seven transistors and one capacitor, and may be referred to as a "7T1C" circuit. Transistor 211 is the drive transistor as described hereinabove, while transistors 212-217 are switching transistors, each of which may be switched by a gate voltage between an ON state in which an electrical current is allowed to flow through the transistor, and an OFF state in which the transistor prevents the current from flowing, thus breaking a circuit. Transistors 213 and 214, which may be referred to as the third and fourth transistors, respectively, embody the first switching circuit 221 of FIG. 2. Transistors 215 and 217, which may be referred to as the fifth and seventh transistors, respectively, embody the second switching circuit 222 of FIG. 2. Transistor 216, which may also be referred to as the sixth transistor, functions as a circuit breaker between the OLED 230 and the drive transistor 211, and is operable to either connect the anode terminal 231 of the OLED 230 with the source 211s of the drive transistor or to disconnect them.

When used in a display apparatus, such as the display apparatus 100 of FIG. 1, the six switching transistors 212-217 may be controlled by gate control signal generated by a gate (address) driver, such as the gate driver 102 shown in FIG. 1. In the display system 100 of FIG. 1, they may be controlled by the control signals 144 S[ ], EM[ ], and SM[ ], with at least some of the control signals S[ ] and EM[ ] shared between adjacent pixels or pixel rows. By way of example, the pixel circuit 200b shown in FIG. 5 may represent a pixel in the display apparatus of FIG. 1 that is positioned in the i-th pixel row. The control signals SM[i] 208, S[i] 206, and EM[i] 207 are the control signals 144 of the i-th row, and are used to control the second (212), fourth (214), and seventh (217) transistors, respectively. In some embodiments at least some of these signals may be shared between adjacent pixels or pixel rows to decrease the overall number of control signals in the display for a given number of switching transistors in each pixel circuit. In the illustrated embodiment the control signals S[i] 206 and EM[i] 207 of the i-th pixel row are shared with adjacent pixel rows. The control signal S[i−1] 209 is the scan control signal of the (i−1)th row, and EM[i+1] 205 and S[i+1] 210 are the emission control and programming control signals of the (i+1)th row, which are shared with the pixel circuits of the i-th row in the pixel array of the display panel 107. All these control signals may be provided by the gate driver 102 by means of the corresponding control lines, as described above with reference to FIG. 1. In some embodiments the reference voltage $V_{REF}$ provided via a reference line 126 and the reference terminal 204 may be common to all pixels on the same row.

Similarly to the pixel circuit 200a of FIG. 2, the 7T1C pixel circuit 200b includes a storage capacitor $C_S$ 240, which in the drive mode stores the data voltage $V_{DATA}$ coming from the source driver 105 via a data line 114, so as to enable the pixel circuit 200b to drive the OLED 230 after being addressed with the scan control signal S[i]. In the embodiment illustrated in FIG. 5 the transistors 211-217 may be p-type transistors, such as p-type TFTs, but implementations of the present disclosure are not limited to pixel circuits having a particular polarity of transistors or only to pixel circuits having thin-film transistors.

Figure 6:
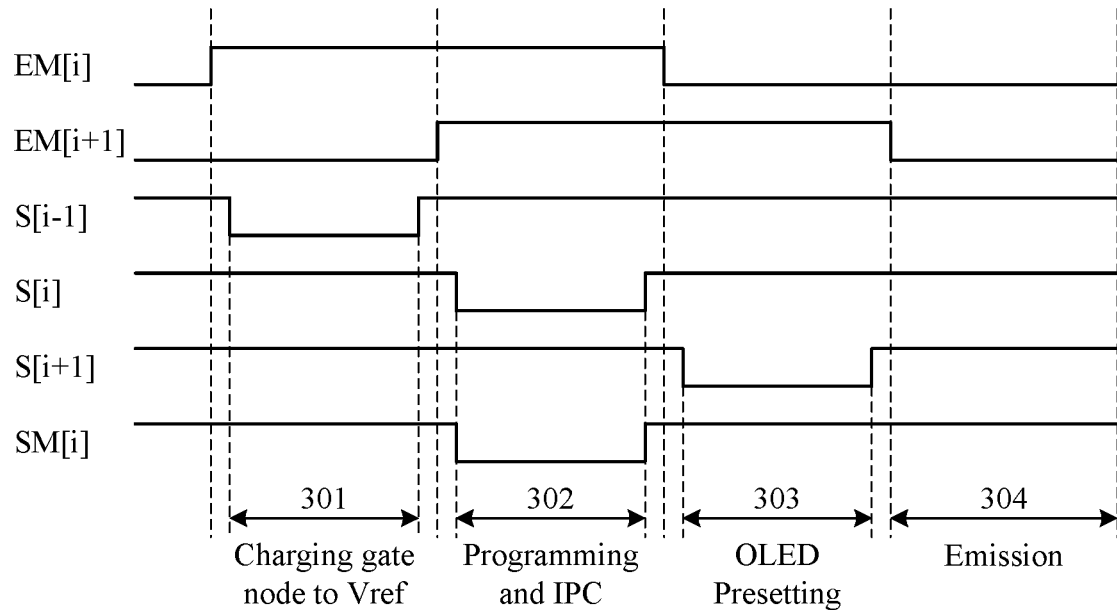
FIG. 6 is an example timing diagram of control signals of the 7T1C pixel circuit of FIG. 3 in a drive mode.
Figure 7:
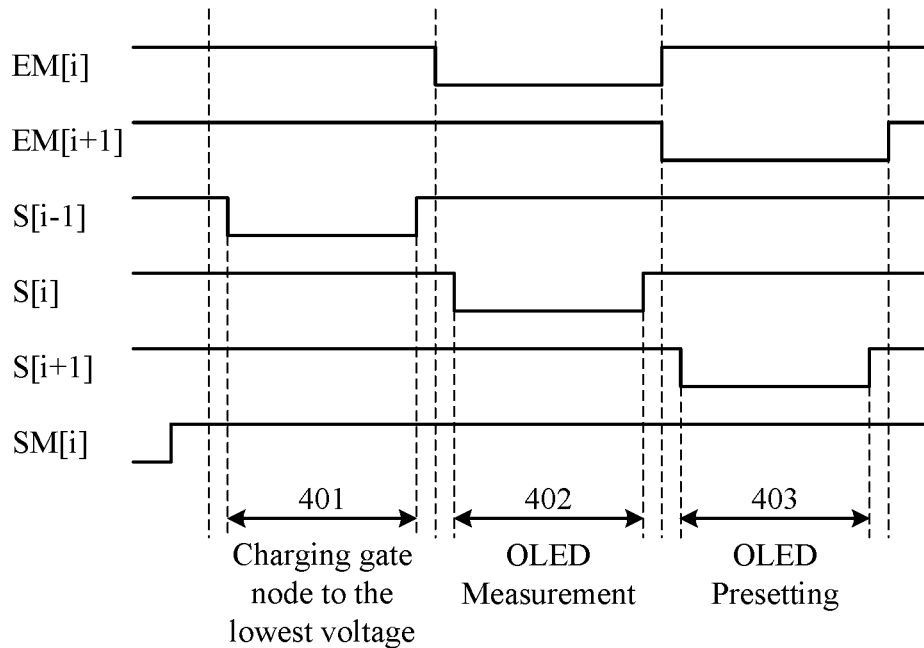
FIG. 7 is an example timing diagram of the control signals of the 7T1C pixel circuit of FIG. 3 in a LED measurement mode.
Figure 8:
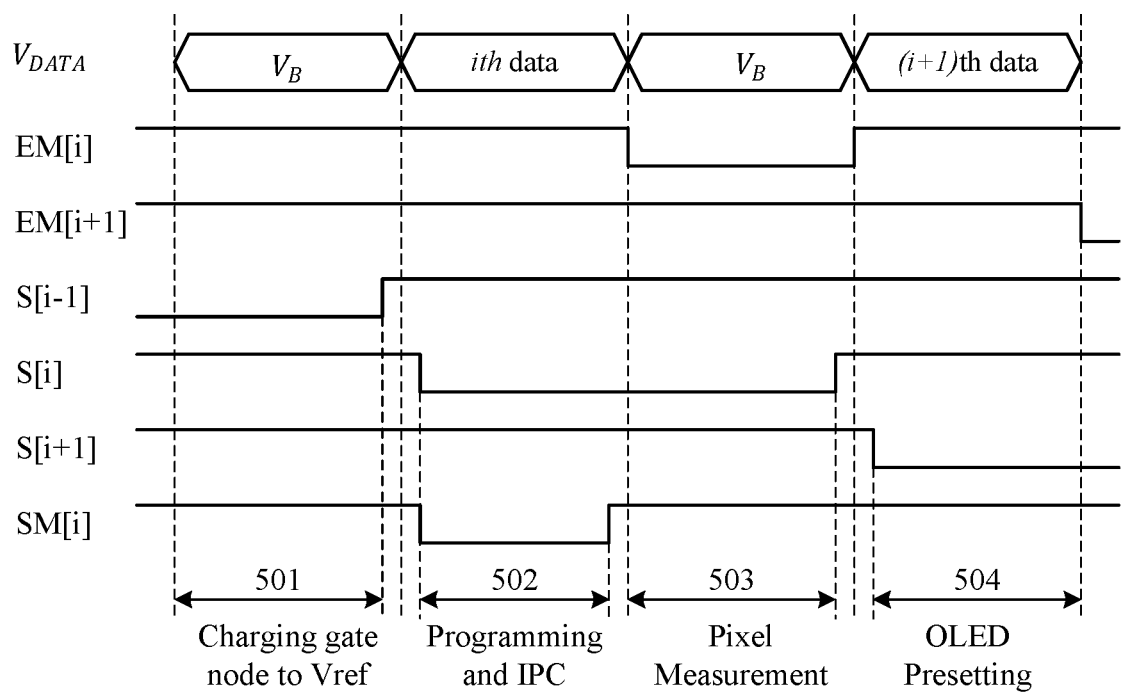
FIG. 8 is an example timing diagram of the control signals of the 7T1C pixel circuit of FIG. 3 in a pixel measurement mode.

The 7T1C pixel circuit 200b may operate in a drive mode, an OLED measurement mode, and a pixel measurement mode, such as for example described hereinabove with reference to FIGS. 3 and 4. Furthermore, in some embodiments these modes may include additional stages such as pre-setting, post-setting, pre-charging, and/or post-charging stages that may improve the display operation in at least some aspects. Example implementations of these modes of operation will now be described with reference to FIGS. 6-19. FIGS. 6, 7, and 8 illustrate example timing diagrams of these three modes in accordance with some embodiments. These timing diagrams show how the control signals 144 S[ ], EM[ ], and SM[ ], which control the states of the switching transistors 212-217 as described hereinabove, change at different stages of the drive mode (FIG. 6), the OLED measurement mode (FIG. 7), and the pixel measurement mode (FIG. 8) in accordance with some embodiments. Each of these signals alternates between a "LOW" and a "HIGH" state, which may correspond to a "LOW" and "HIGH" voltage level at the gate of a corresponding switching transistor. For the example embodiment described herein, the switching transistors 212-217 are p-type, and are switched OFF by a "HIGH" voltage level at its gate, and switched ON by a "LOW" voltage level at its gate. By way of example, the LOW voltage may correspond to less than about 0.2V, and the "HIGH" voltage may correspond to about 5V or more, for example about 10V, but these levels may depend on the transistor technology. It will be appreciated that in other embodiments the switching transistors may be switched ON, i.e. to their conducting state, by a "HIGH" signal or "HIGH" voltage level, and switched "OFF" by a "LOW" signal or "LOW" voltage level; in such embodiments each of the control signals in the timing diagrams of FIGS. 6-8 would be inverted.

Drive Mode

Referring first to FIG. 6, it illustrates a timing diagram of the drive mode in accordance with an embodiment. This timing diagram shows how the control signals S[i−1], S[i], S[i+1], EM[i], EM[i+1], and SM[i], which control the states of the switching transistors 212-217 of a pixel circuit 200b of the i-th pixel row as described hereinabove, change at different stages of the drive mode; here and in the following the row index "i" may be any integer from 1 to N, wherein N is the number of pixel rows in the display. In the illustrated embodiment, the drive mode comprises four stages 301-304, in which the pixel circuit 200b is switched between four different states. These four stages 301-304, which may represent one cycle of programming of a pixel during one frame period of a received video signal, include stage 301 of pre-charging the capacitor 240 to a reference voltage $V_{REF}$, stage 302 of pixel programming with a data signal and In-Pixel Compensation (IPC), stage 303 of OLED pre-setting, and stage 304 of light emission. In the first stage 301, which may be referred to as the pre-charging stage, the storage capacitor $C_S$ 240 may be pre-charged to $V_{REF}$ by connecting it to a source of reference voltage, such as the reference line 126. In the programming stage 302, which may include IPC, the data voltage $V_{DATA}$ received over a data line is stored in the storage capacitor $C_S$ 240. In an OLED pre-setting stage 303, the OLED 230 is pre-set to a reference voltage $V_{REF}$. In the emission stage 304, the drive transistor 211 drives the OLED 230 with the current I corresponding to the data voltage $V_{DATA}$.

These four stages 301-304 of the drive mode correspond to four states of the pixel circuit 200b that are illustrated in FIGS. 9-12. In these figures, as well as FIGS. 13-19, the switching transistors 212-213 are schematically shown as switches in their corresponding "ON" (closed) and "OFF" (open) states.

Figure 9:
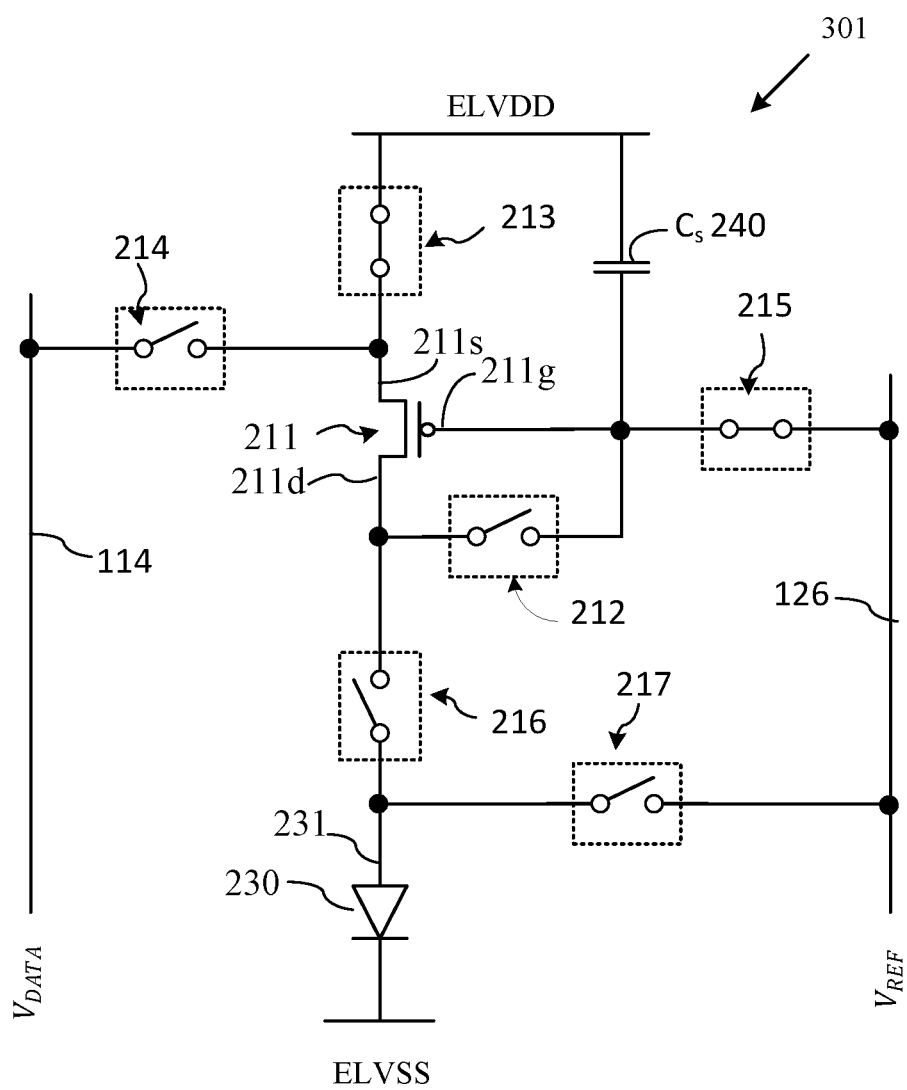
FIG. 9 is a schematic block diagram of the 7T1C pixel circuit of FIG. 5 at a pre-charging stage of the drive mode.

The state of the pixel circuit 200b at the pre-charging stage 301 is illustrated in FIG. 9. In this state, the S[i−1] signal 209 is set to LOW, e.g. S[i−1]=0, which turns on the fifth transistor 215 thereby providing or activating an electrical connection between the gate 211g of the drive transistor 211 and a reference line 126, and the gate 211g of the drive transistor is charged with a reference voltage $V_{REF}$. At this stage, all other switching transistors 212-214, 216, 217 may be switched off, breaking the respective circuits.

Figure 10:
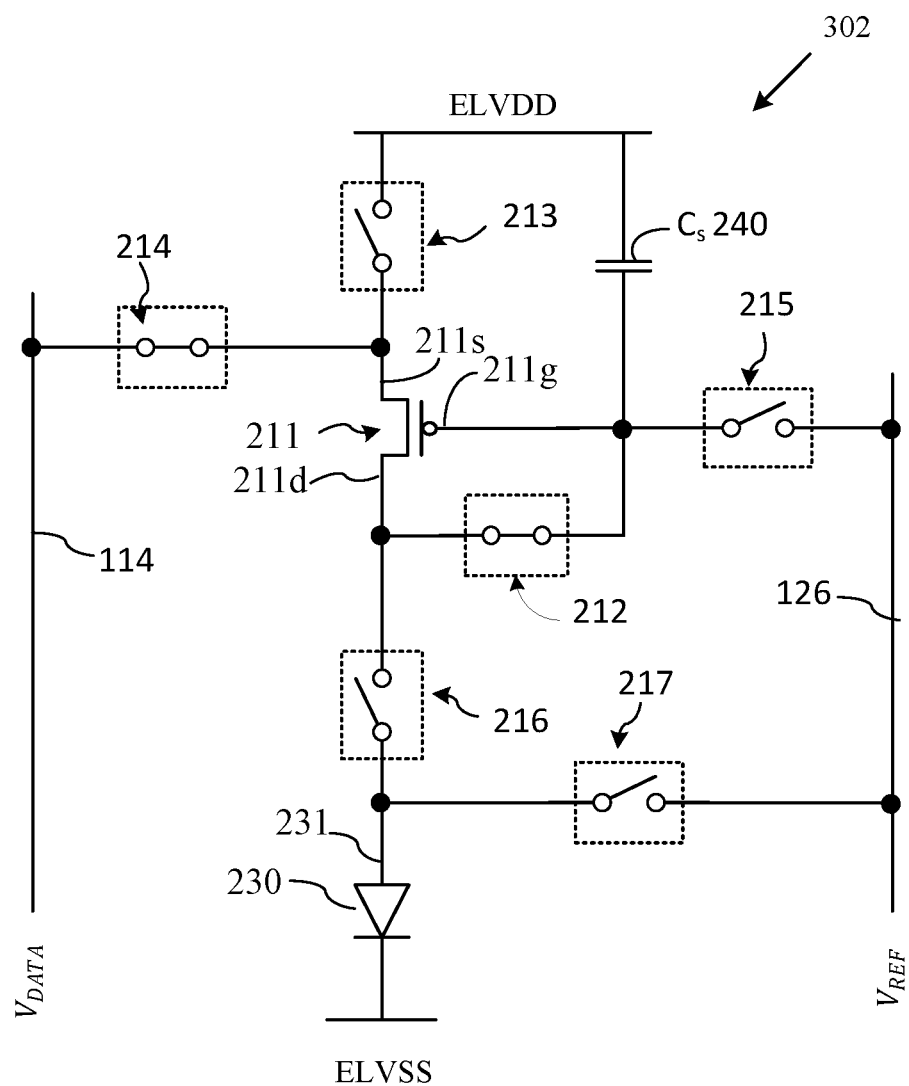
FIG. 10 is a schematic block diagram of the 7T1C pixel circuit of FIG. 5 at a programming stage of the drive mode.

The state of the pixel circuit 200b at the programming stage 302 is shown in FIG. 10. At this stage the S[i] signal 206 and SM[i] signal 208 are set to "LOW", e.g. S[i]=0 and SM[i]=0. These signals turn on the fourth transistor 214 and the second transistor 212, thereby providing or activating electrical connections between the source 211s of the drive transistor 211 and the data line 114, and between the gate 211g and the drain 211d of the drive transistor 211. The source 211s of the drive transistor 211 is charged to $V_{DATA}$ where the data voltage $V_{DATA}$ is sourced from the source driver 105. The drive transistor 211 turns on and the gate terminal node 211g is discharged to $(V_{DATA}-V_{TH})$ where $V_{TH}$ is the threshold voltage of the drive transistor 211. At the end of this state, the drive transistor 211 turns off and the voltage $V_{C_S}$ stored in the storage capacitor 240 may be found from equation (1):

$$V_{C_S} = ELVDD - V_{DATA} - V_{TH} \tag{1}$$

In some embodiments $V_{REF}$ may be selected so that it is equal or smaller than $(V_{DATA}-V_{TH})$. By way of example, in one embodiment $V_{REF}$ may be in the range of 2 to 4 V, ELVDD may be 10V, $V_{DATA}$ may be in the range of 4V and 10V, $V_{TH}$ may be about 1V, and $V_{REF}$ may be about 3 V.

Figure 11:
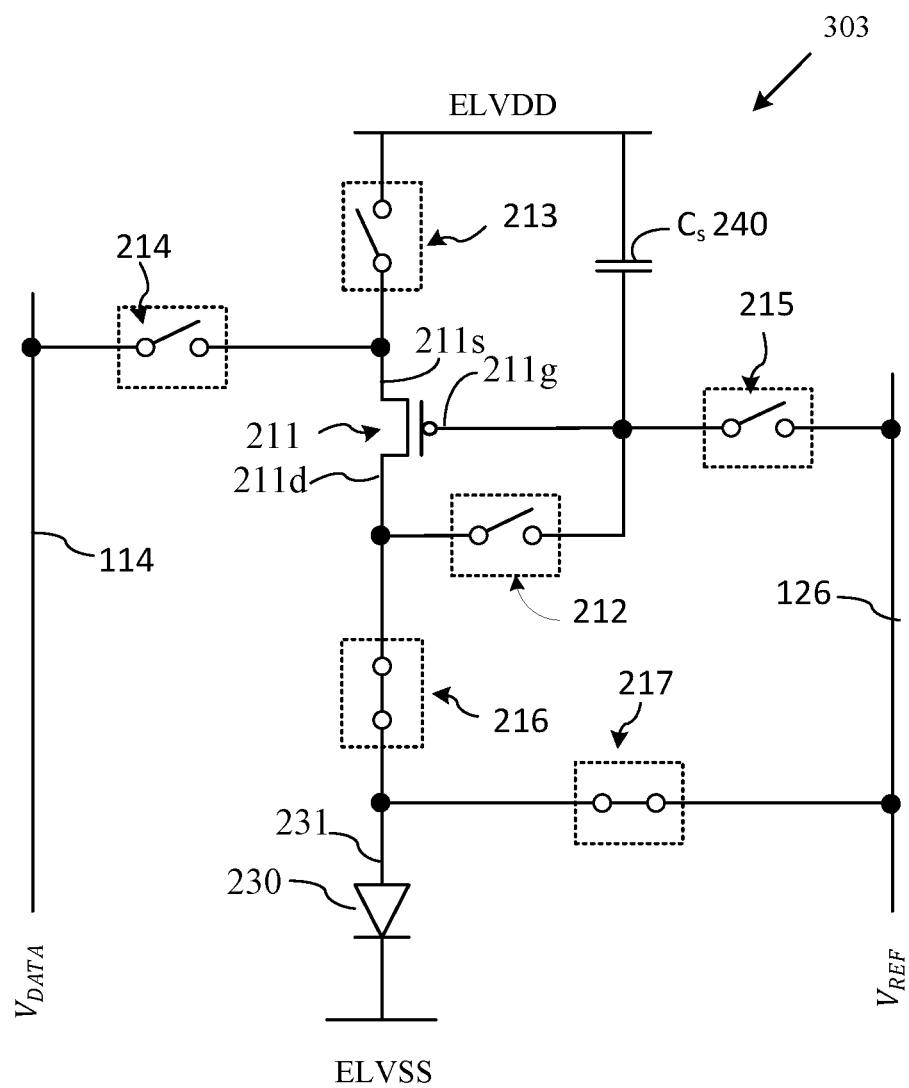
FIG. 11 is a schematic block diagram of the 7T1C pixel circuit at an OLED pre-setting stage of the drive mode.

The state of the pixel circuit 200b at the third, OLED pre-setting stage 303 is shown in FIG. 11. At this stage the S[i+1] signal 210 and EM[i] signal 207 are set to "LOW", e.g. S[i+1]=0 and EM[i]=0. The S[i+1] signal 210 turns on the seventh transistor 217, thereby activating an electrical connection between the OLED 230 and a reference line 126. In this OLED pre-setting state the OLED anode terminal or node 231 is connected to the reference line 126 and is set to the reference voltage $V_{REF}$. The reference voltage $V_{REF}$ at the OLED pre-setting stage may be equal to $V_{REF}$ at the pre-charging stage of the drive mode, or may differ therefrom. In some embodiments $V_{REF}$ at the OLED pre-setting stage may be selected close or just under a threshold voltage of the OLED at which the OLED start to emit light.

Figure 12:
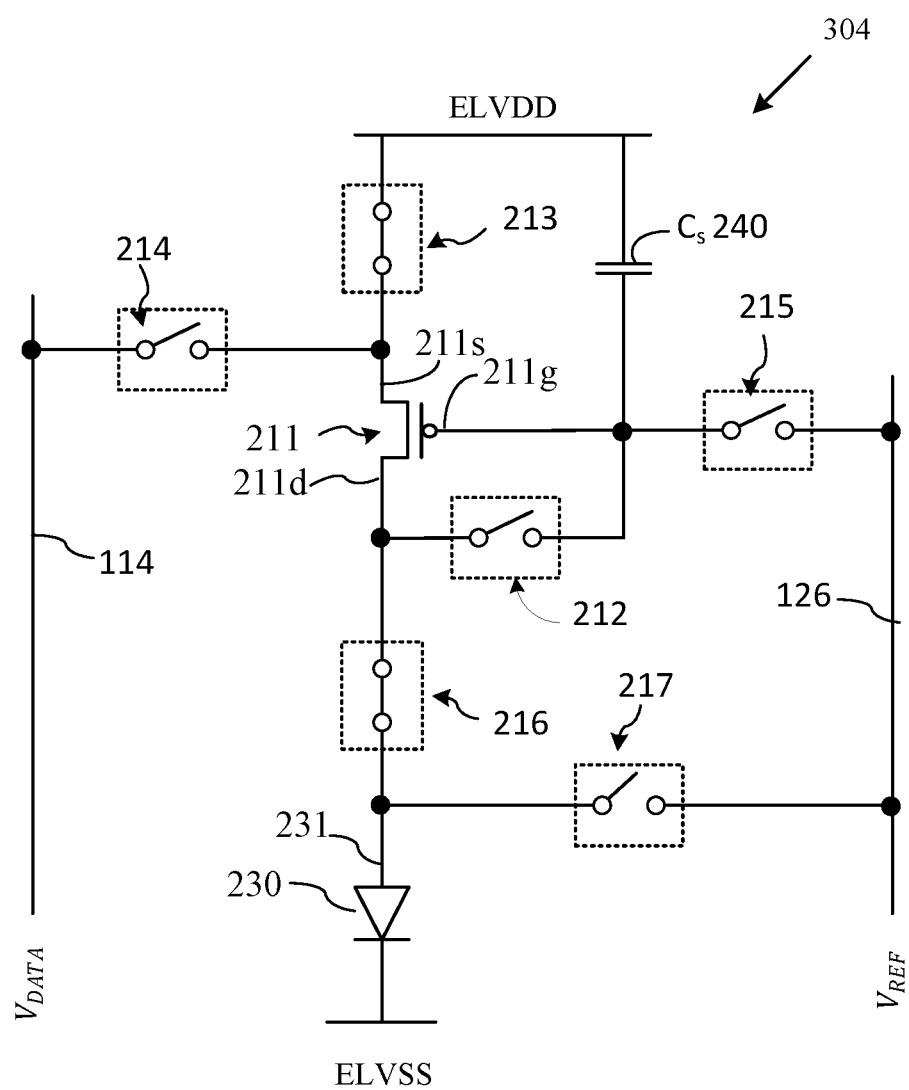
FIG. 12 is a schematic block diagram of the 7T1C pixel circuit of FIG. 5 at an emission stage of the drive mode.

The state of the pixel circuit 200b at the fourth, emission, stage 304 is shown in FIG. 12. At this stage the EM[i] signal 207 and EM[i+1] signal 205 are set to "LOW", e.g. EM[i]=0 and EM[i+1]=0, which activates the electrical connections of the source 211s of the drive transistor 211 to the power supply voltage ELVDD, and from the drain 211d of the drive transistor 211 to the OLED 230. The electrical current $I_{pixel}$ that flows through the drain transistor to the OLED 230 at this stage, causing the OLED to emit light, may be determined from equation (2):

$$I_{pixel} = k(V_{gs} - V_{TH})^2 = k(ELVDD - (V_{DATA} - V_{TH}) - V_{TH})^2$$
$$I_{pixel} = k(ELVDD - V_{DATA})^2 \qquad (2)$$

Therefore the luminance of the OLED 230 in the drive mode is determined by the current $I_{pixel}$ which is independent of the threshold voltage $V_{TH}$ of the drive transistor 211, and is generally defined by the power line voltage ELVDD and the data line voltage $V_{DATA}$. Nevertheless, the luminance of the OLED 230 for a given $V_{DATA}$ may change during the lifetime of the display for other reasons, such as changes in the carrier mobility in the drive transistor that affect the k coefficient in equation (2), or due to OLED aging.

OLED Measurement Mode

In this mode, an OLED current $I_{OLED}$ at one or more known voltages is measured to determine the I-V characteristic of the OLED 230 and to detect changes in it; the results of the measurement may then be utilized to compensate for the OLED aging when generating $V_{DATA}$. The timing diagram for the control signals S[i], SM[i], and EM[i], S[i−1], S[i+1,] EM[i+1] of the T1C pixel circuit 200b of the i-th row in an example implementation of the OLED measurement mode is shown in FIG. 7. In the illustrated embodiment the OLED measurement mode includes a pre-charging stage 401, which is followed by an OLED measuring stage 402. This mode may also include an OLED pre-setting stage 403 that may be similar to the OLED pre-setting stage 305 of the drive mode described hereinabove. These three stages correspond to three states of the pixel circuit 200b that are illustrated in FIGS. 13-15.

Figure 13:
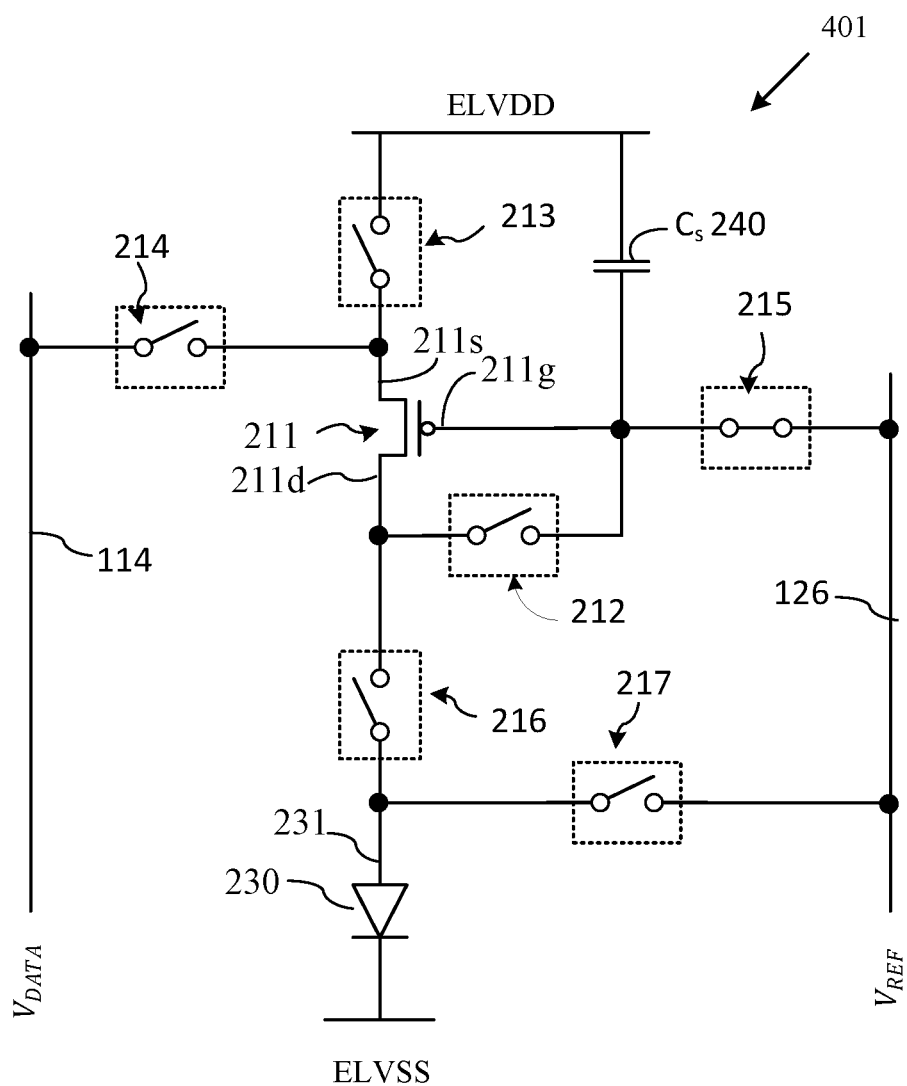
FIG. 13 is a schematic block diagram of the 7T1C pixel circuit of FIG. 5 at charging stage of the OLED measurement mode.

In the pre-charging stage 401 of the OLED measuring mode, the gate terminal or node 211g of the drive transistor 211, and the storage capacitor 240, are pre-charged to a suitably low voltage to turn the drive transistor 211 into a switch in an ON state The state of the pixel circuit 200b at the first, pre-charging stage 401 of the OLED measurement mode is shown in FIG. 13. At this stage the S[i−1] signal 209 (FIG. 5) is set to "LOW", e.g. S[i−1]=0, which turns on the fifth transistor 215. This provides or activates an electrical connection between the gate terminal or node 211g of the drive transistor 211 and the reference line 126, so that the gate 211g is charged to a reference voltage $V_{REF}$. This stage may be substantially same as stage 271 of the OLED measurement mode of method 260 described hereinabove with reference to FIG. 3. In the OLED measurement mode, the drive transistor 211 behaves therefore like a switch, with $V_{REF}$ suitably low, so as to increase the gate-source voltage $V_{gs}$ of the drive transistor 211 and to push it to the triode region of transistor operation where a transistor behaves like a switch in the ON state. In some embodiments, the reference voltage $V_{REF}$ during the pre-setting stage of the OLED measurement mode may be the lowest voltage of the pixel circuit.

Figure 14:
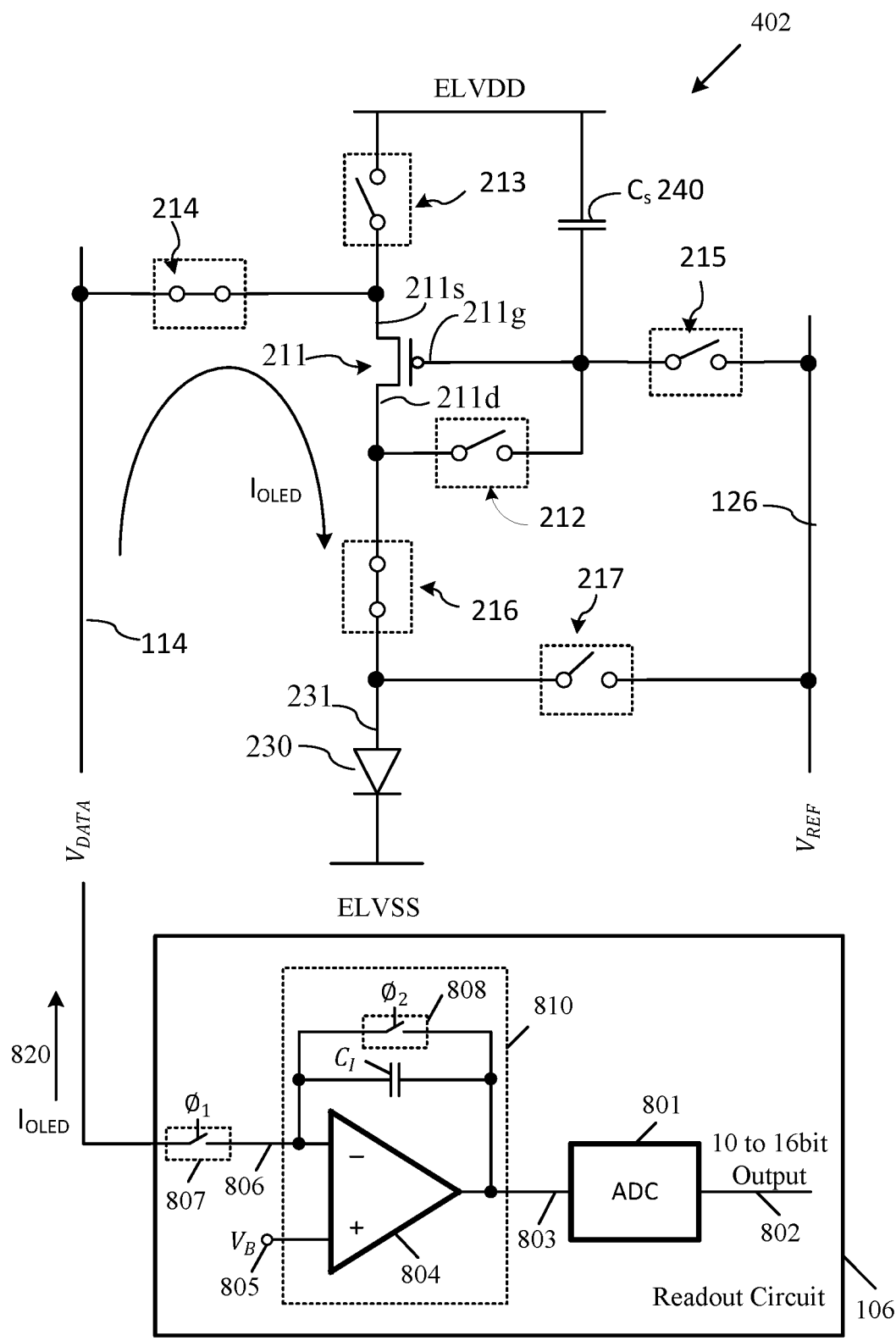
FIG. 14 is a schematic block diagram of the 7T1C pixel circuit of FIG. 5 at an OLED measuring stage of the OLED measurement mode.
Figure 15:
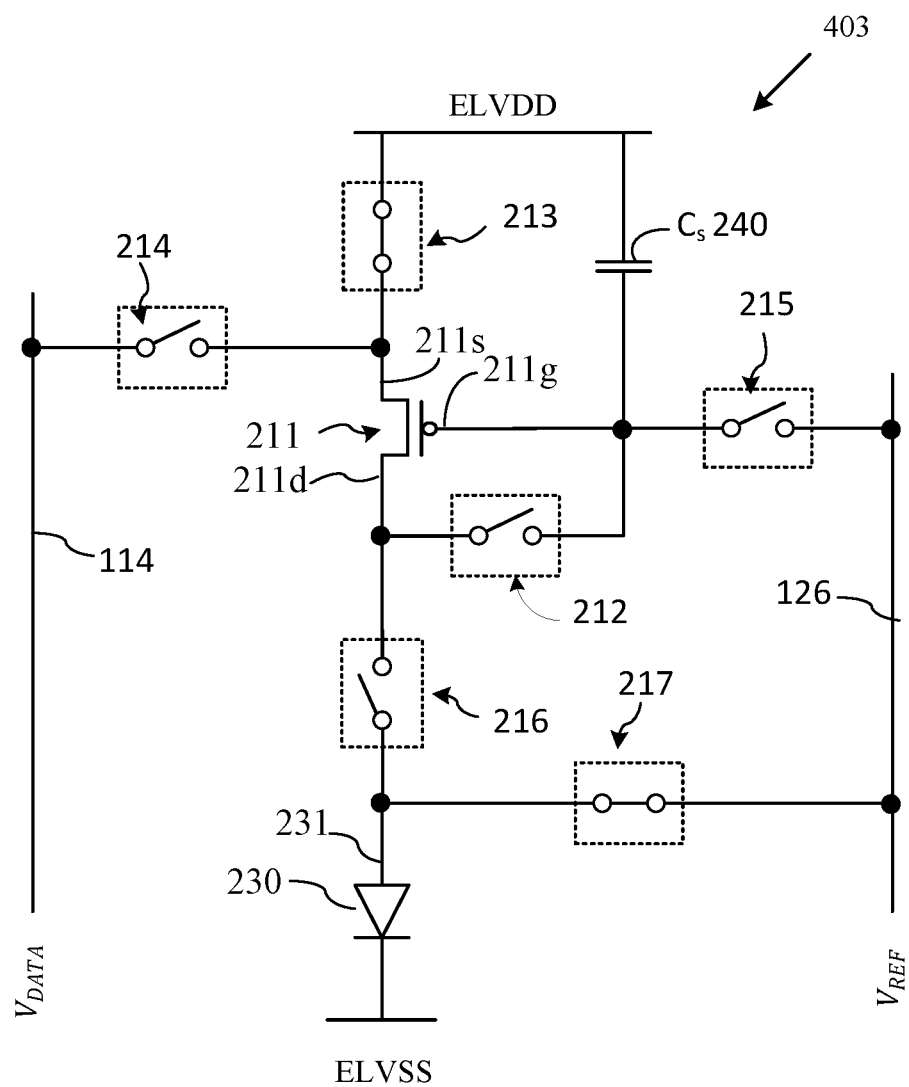
FIG. 15 is a schematic block diagram of the 7T1C pixel circuit of FIG. 5 at an OLED pre-setting stage of the OLED measurement mode.

The state of the pixel circuit 200b at the second, measuring stage 402 is shown in FIG. 14. In this state the S[i] signal 206 and EM[i] signal 207 are set to "LOW", e.g. S[i]=0 and EM[i]=0. These signals turn on the fourth transistor 214 and the sixth transistor 216, thereby establishing an electrical connection between the OLED terminal 231 and the data line 114. The OLED 230 is thereby connected to the data line 114 through the drive transistor 211, the fourth transistor 214 and the sixth transistor 216, thereby enabling an electrical current to flow from the data line into the OLED. In this stage of the OLED measurement mode, the data line 114 is connected to the Readout Circuit (ROC) 106, to measure the OLED current $I_{OLED}$ 820 using suitable current measuring circuitry, for example as indicated at 810. The ROC 106 may also provide a pre-defined bias voltage $V_B$ to the OLED via the data line 114, so that the OLED current $I_{OLED}$ measured by the ROC 106 corresponds to a known bias voltage. In some embodiments the OLED current $I_{OLED}$ 820 measured at this stage may be converted to voltage, which may be then quantized to a desired quantization bit depth by an Analog-To-Digital Converter (ADC) 801, for example it may be converted to a 10 to 16 bit digital code.

In some embodiment the OLED measuring stage 402 of the OLED measurement mode may be followed by the OLED pre-setting stage 403, which is generally similar to the OLED pre-setting stage 305 of the drive mode described hereinabove. The state of the pixel circuit 200b at this stage is illustrated in FIG. 15. In this third state 403, the S[i+1] signal 210 and EM[i+1] signal 205 are set to "LOW", e.g. S[i+1]=0 and EM[i+1]. The S[i+1] signal 210 turns on the seventh transistor 217, connecting the anode node 231 of the OLED 230 to the reference line 126, so it is charged to a reference voltage $V_{REF}$.

Pixel Measurement Mode

In this mode the pixel current corresponding to a known voltage $V_{DATA}$ is measured. This mode enables to assess characteristics of the drive transistor 211 in its nominal mode of operation, i.e. in the drive mode. The timing diagram for the control signals S[i], SM[i], and EM[i], S[i−1], S[i+1,] EM[i+1] of the 7T1C pixel circuit 200b of the i-th row in an example implementation of the pixel measurement mode is shown in FIG. 8. In the illustrated embodiment the pixel measurement mode comprises stage 501 of pre-charging the gate terminal or node 211g of the drive transistor 211, and the storage capacitor 240, to a reference voltage $V_{REF}$, stage 502 of programming the pixel circuit with the data voltage $V_{DATA}$, and a pixel measuring stage 503 in which the pixel $I_{pixel}$ current is measured through a data line. This mode may also include an OLED pre-setting stage 504 that may be similar to the OLED pre-setting stages 403, 305 of the drive mode and the OLED measurement mode described hereinabove. These four stages correspond to four states of the pixel circuit 200b that are illustrated in FIGS. 16-19. The pre-charging stage 501 and the programming stage 502 of the pixel measurement mode may be similar to the pre-charging stage 301 and the programming stage 302 of the drive mode described hereinabove.

Figure 16:
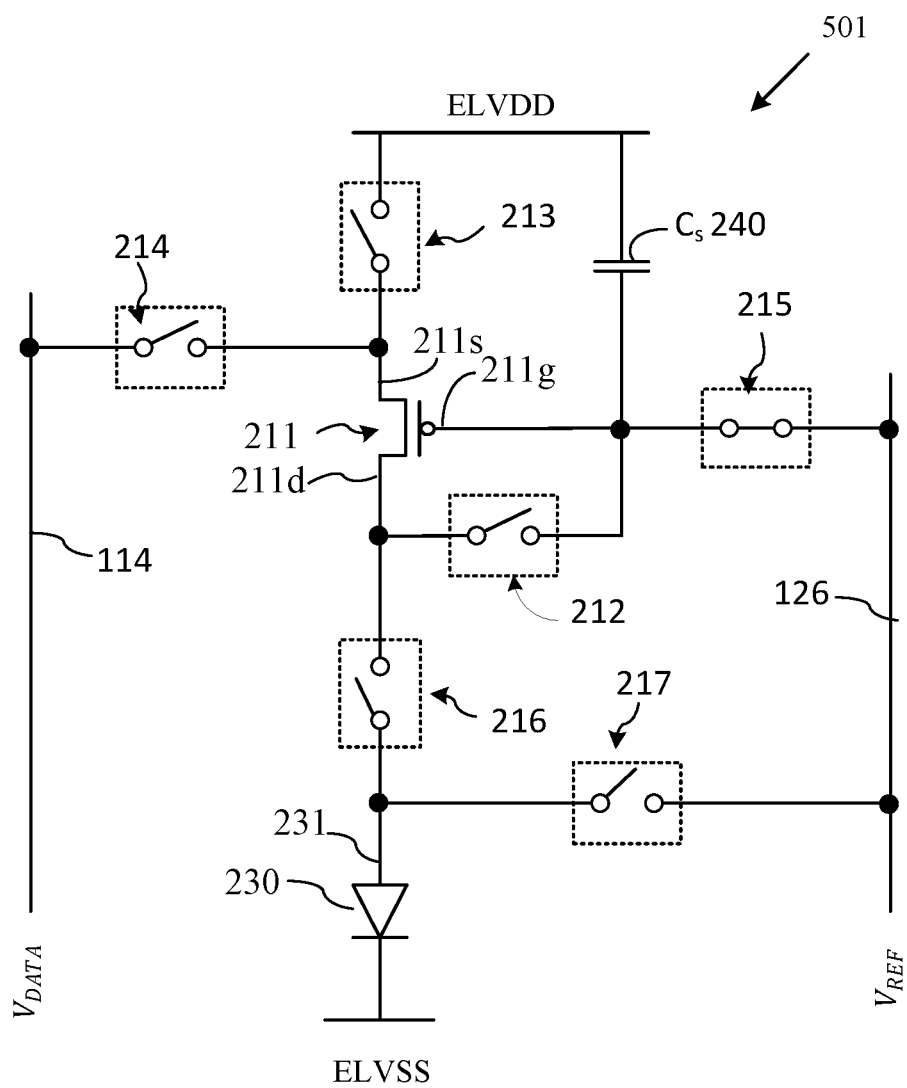
FIG. 16 is a schematic block diagram of the 7T1C pixel circuit of FIG. 5 at a pre-charging stage of the pixel measurement mode.

In the first, pre-charging stage 501 the pixel circuit 200b may be in a state shown in FIG. 16. At this stage the S[i−1] signal 209 (FIG. 5) is set to "LOW", e.g. S[i−1]=0, which turns on the fifth transistor 215 to electrically connect the gate terminal or node 211g of the drive transistor to the reference line 126, whereby pre-charging the storage capacitor 240 and providing a reference voltage $V_{REF}$ to the gate 211g of the drive transistor 211. At this stage, all other switching transistors 212-214, 216, 217 may be switched off.

Figure 17:
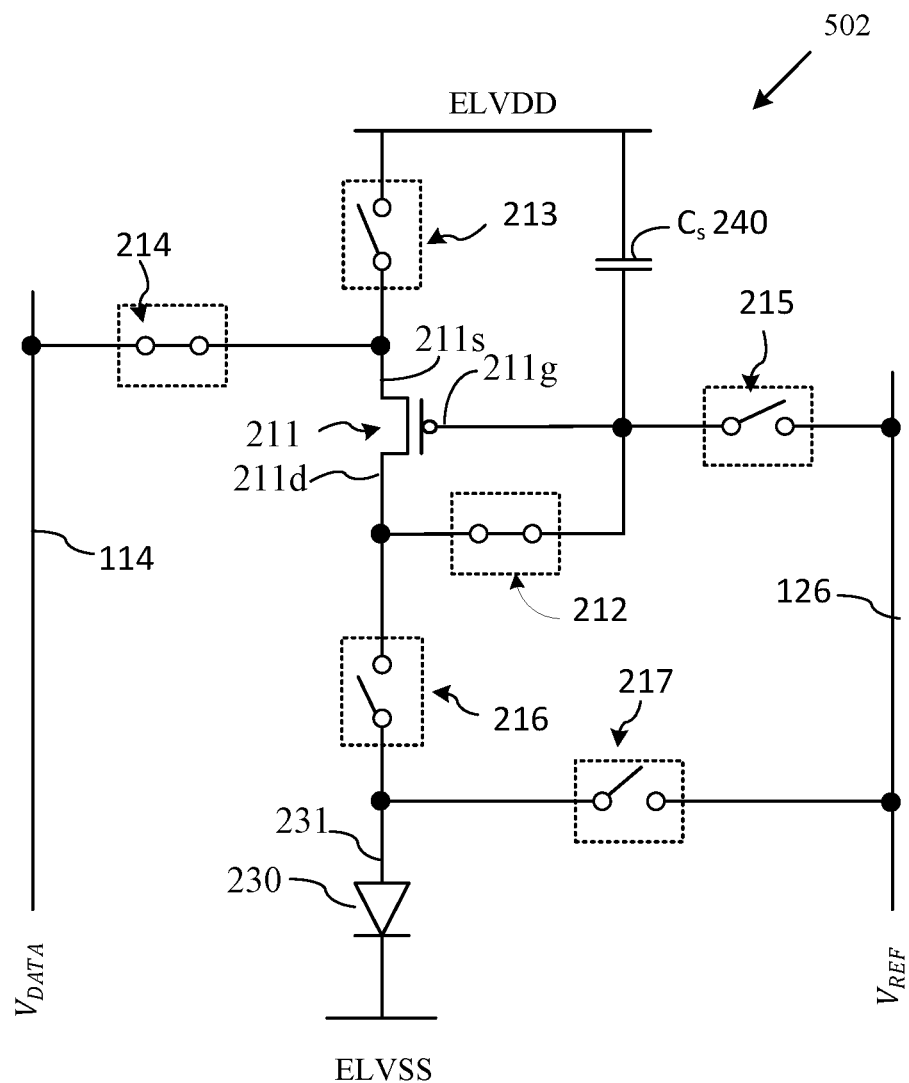
FIG. 17 is a schematic block diagram of an embodiment of a 7T1C pixel circuit of FIG. 5 at a programming stage of the pixel measurement mode.

In the second, programming stage 502 the pixel circuit 200b may be in a state shown in FIG. 17. At this stage the S[i] signal 206 and SM[i] signal 208 are set to "LOW", e.g. S[i]=0 and SM[i]=0. These signals turn on the fourth transistor 214 and the second transistor 212, thereby providing or activating electrical connections between the source 211s of the drive transistor 211 and the data line 114, and between the gate 211g and the drain 211d of the drive transistor 211.

The source 211s of the drive transistor 211 is connected to the data line and is charged to $V_{DATA}$ where the data voltage $V_{DATA}$ is coming from the source driver 105. The drive transistor 211 turns on and the gate terminal or node 211g is discharged to ($V_{DATA}-V_{TH}$) where $V_{TH}$ is the threshold voltage of the drive transistor 211. At the end of this state, the drive transistor 211 turns off and the voltage $V_{C_s}$ stored in the storage capacitor 240 may be found from equation (1) given above.

Figure 18:
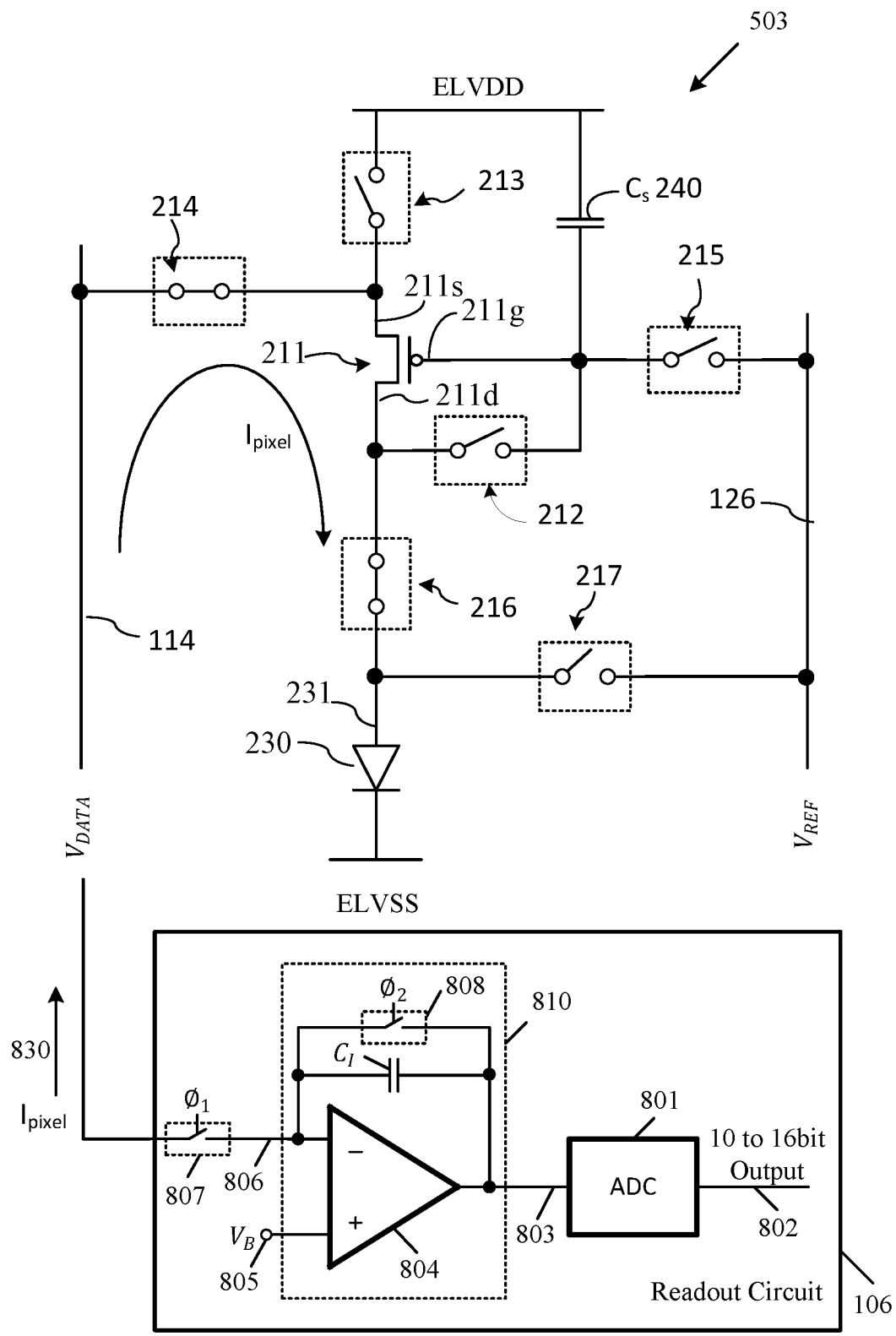
FIG. 18 is a schematic block diagram of the 7T1C pixel circuit of FIG. 5 at a pixel measuring stage of the pixel measurement mode.

In the third, pixel measuring stage 503 the pixel circuit 200b may be in a state shown in FIG. 18. This stage, and the corresponding state of the pixel circuit, may be same or similar to the measuring stage 402 of the OLED measurement mode. At this stage the S[i] signal 206 and EM[i] signal 207 are set to "LOW", e.g. S[i]=0 and EM[i]=0. These signals turn on the fourth transistor 214 and the sixth transistor 216, thereby establishing an electrical connection between the OLED terminal 231 and the data line 114. The OLED 230 is thereby connected to the data line 114 through the drive transistor 211, the fourth transistor 214 and the sixth transistor 216, thereby enabling an electrical current to flow from the data line into the OLED. In the pixel measurement mode, this current, which may be termed pixel current and denoted $I_{pixel}$, is determined by the data voltage $V_{DATA}$ that was provided at the programming stage 502, and a bias voltage $V_B$ which may be provided to the pixel circuit over the data line 114 in the measuring stage 503. The bias voltage $V_B$ may be chosen to be high enough, for example close to ELVDD, in the pixel measurement mode so that the pixel current is within its normal operating range. At the measuring stage 503 of the pixel measurement mode, the data line 114 is connected to the ROC 106, to measure the pixel current $I_{pixel}$ 830 using the current measuring circuit 810, or any other suitable current measuring circuit or device.

ROC 106 may also provide the bias voltage $V_B$ to the OLED 230 via the data line 114. In some embodiments the pixel current $I_{pixel}$ 830 measured at this stage may be converted to voltage, which may be then quantized to a desired quantization bit depth, for example it may be converted to a 10 to 16 bit digital code, by an Analog-To-Digital Converter (ADC) 801.

The voltage of the data line 114 is approximately $V_B$ during the pixel current measurement, therefore the gate-source voltage $V_{gs}$ of the drive transistor 211 may be estimated from equation (3):

$$V_{gs}=V_B(V_{DATA}-V_{TH}) \quad (3)$$

and the pixel current $I_{pixel}$ 830 may be determined approximately from the following equation (4):

$$I_{pixel}=k(V_{gs}-V_{TH})^2=k(V_B-V_{DATA})^2 \quad (4)$$

Therefore the pixel current 830 $I_{pixel}$ measured in the pixel measurement mode is independent of the threshold voltage deviations of the drive transistor 211. The dependence of the pixel current 830 measured in this mode on the known bias and data voltages $V_B$ and $V_{DATA}$ may be used to determine changes in characteristics of the drive transistor, such as for example its mobility, which affect the circuit performance in the drive mode. Results of the measurement may then be utilized to compensate for the transistor aging when generating $V_{DATA}$.

Figure 19:
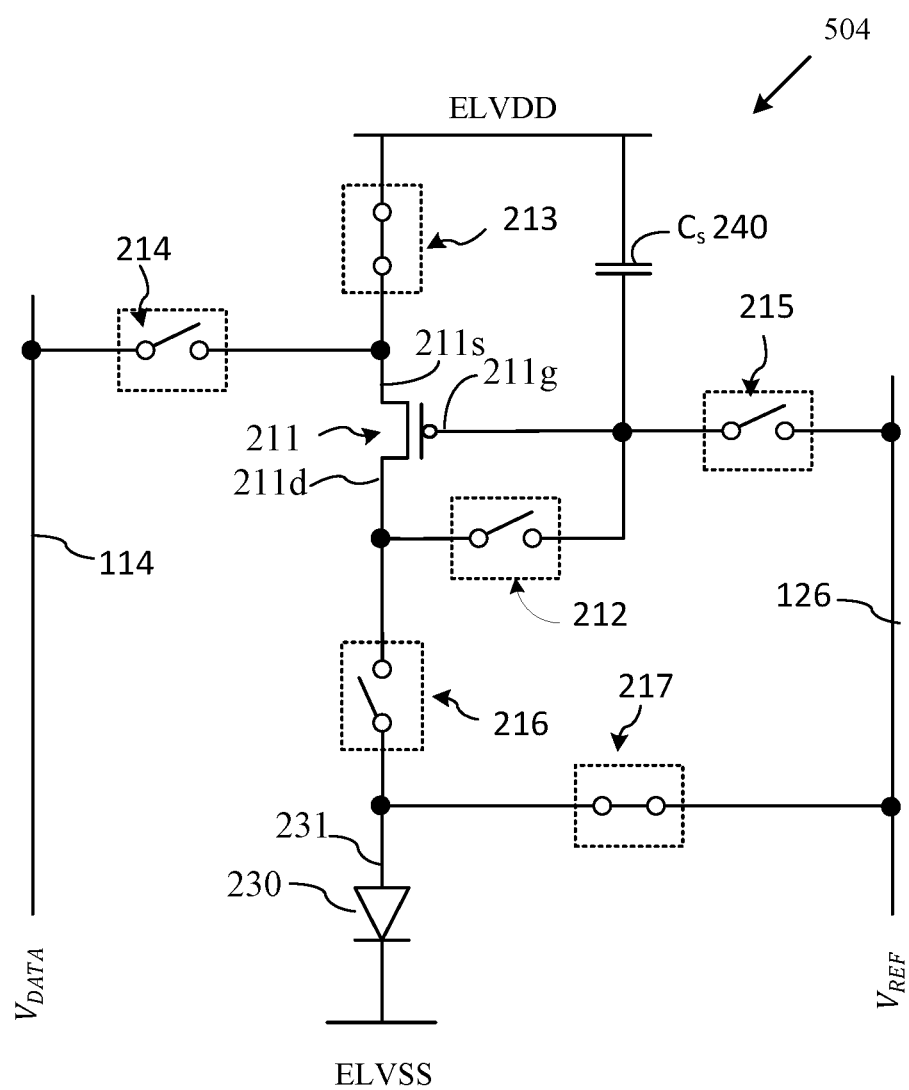
FIG. 19 is a schematic block diagram of the 7T1C pixel circuit of FIG. 5 at an OLED pre-setting stage of the pixel measurement mode.

In some embodiment the measuring stage 503 of the pixel measurement mode may be followed by the OLED pre-setting stage 504, which is generally similar to the OLED pre-setting stages 305, 403 of the drive mode and the OLED measurement mode described hereinabove. The state of the pixel circuit 200b at this stage is illustrated in FIG. 19. In this state, the S[i+1] signal 210 and EM[i+1] signal 205 (FIG. 5) are set to "LOW", e.g. S[i+1]=0 and EM[i+1]. The S[i+1] signal 210 turns on the seventh transistor 217, connecting the anode terminal or node 231 of the OLED 230 to the reference line 126, so it is charged to a reference voltage $V_{REF}$.

As shown in FIG. 14 and FIG. 18, in some embodiments ROC 106 may include an input switch 807 for connecting ROC 106 to a data line, a current measurement circuit 810, which may be embodied as an integrator, and an ADC 801. The integrator 810 may include a reset switch 808, a differential amplifier 804, and an integrating capacitor $C_I$ which may be connected between the output terminal 803 and the negative input terminal 806 of the differential amplifier 804 to provide a negative feedback to the differential amplifier. A bias voltage source 805 configured to generate the bias voltage $V_B$ may be connected to the positive input terminal of the differential amplifier 804. The integrator 810 integrates the current coming from pixel circuit 200 ($I_{pixel}$ 830 or $I_{oled}$ 820) and converts it to a corresponding voltage. The voltage at the output terminal 803 of the integrator 810 may be fed to the ADC 801, which converts this voltage to a digital code 802, for example 10 to 16 bit long, to present the measured pixel current in a form that could be used by a digital processor, such as for example a digital processor or processors embodying the controller 103.

The value of the reference voltage $V_{REF}$ that is provided to a particular pixel row of the display at a given time during the display operation may vary depending on a particular stage of operation. For example in some embodiments when operating in the OLED measurement mode, the reference voltage source 108 may provide to the pixel circuits of an i-th row, over the reference line 126i, a first reference voltage $V_{REF1}$ when pixel circuits of the i-th pixel row are in the pre-charging stage 401 of the LED measuring mode, and to provide to the same pixel circuits a second reference voltage value $V_{REF2}$ during the OLED pre-setting stage 303, 403, 504. In some embodiments the reference voltage source 108 may provide to the pixel circuits of the i-th row a third reference voltage $V_{REF3}$ when the pixel circuits of the i-th row are in the pre-charging stages 501 or 301 of the pixel measurement mode or the drive mode, and to provide to the same pixel circuits the second reference voltage value $V_{REF2}$ during the OLED pre-setting stages 304 or 504. In some embodiments $V_{REF2}$ may be equal to $V_{REF3}$, and greater than $V_{REF1}$.

With reference to FIG. 1, in embodiments wherein the reference voltage $V_{REF}$ provided to a pixel circuit 200 varies depending on a particular stage of operation, the reference voltage source 108 may provide different values of the reference voltage $V_{REF}$ to different pixel rows, so that for example the reference lines 126i and 126n may be at different values of the reference voltage $V_{REF}$ at a particular moment of time. Referring to FIG. 7 by way of example, when the pixel circuits of an (i+1)th row are in the pre-charging stage 401 of the OLED measurement mode and receive the first reference voltage $V_{REF1}$, the pixel circuits of the (i−1)th row are in the OLED pre-setting stage 403, and may receive the second reference voltage $V_{REF2}$.

Thus in some embodiments the reference voltage source 108 may be configured to provide different values of the reference voltage $V_{REF}$ to adjacent pixel rows, and to alternate the reference voltage provided to each pixel row between different levels in synchronization with changes in the control signals 144.

The above-described exemplary embodiments are intended to be illustrative in all respects, rather than restrictive, of the present invention. Indeed, various other embodiments and modifications to the present disclosure, in addition to those described herein, will be apparent to those of ordinary skill in the art from the foregoing description and accompanying drawings.

For example, it will be appreciated that although the operation of the pixel circuits described hereinabove were described with reference to the display system 100 illustrated in FIG. 1, they may also be used in display systems that differ in one or more aspects from that illustrated in FIG. 1. For example, the gate control signals that control the operation of the gates of the switching transistors in the pixel circuit 200*b* of FIG. 5 may be organized differently than described above. Furthermore, although the pixel circuits described hereinabove enable measuring the OLED and pixel characteristics, they also provide other advantages, such as IPC, OLED pre-setting, and drive transistor pre-charging, and may also be employed in display systems that do not use pixel measurements. Furthermore, embodiments described hereinabove may also be adapted for use with light emitting devices (LEDs) other than OLEDs, such as for example with light emitting diodes made in non-organic materials.

Furthermore, although the description hereinabove may include mathematical equations to assist in understanding of some features of the example embodiments being described, the principles of operation and main features of the described embodiments do not necessarily depend on the accuracy or validity of the equations.

Furthermore in the description above, for purposes of explanation and not limitation, specific details are set forth such as particular architectures, interfaces, techniques, etc. in order to provide a thorough understanding of the present invention. In some instances, detailed descriptions of well-known devices, circuits, and methods are omitted so as not to obscure the description of the present invention with unnecessary detail. Thus, for example, it will be appreciated by those skilled in the art that block diagrams herein can represent conceptual views of illustrative circuitry embodying the principles of the technology. All statements herein reciting principles, aspects, and embodiments of the invention, as well as specific examples thereof, are intended to encompass both structural and functional equivalents thereof. Additionally, it is intended that such equivalents include both currently known equivalents as well as equivalents developed in the future, i.e., any elements developed that perform the same function, regardless of structure. Furthermore, it will be appreciated that each of the example embodiments described hereinabove may include features described with reference to other example embodiments.

Thus, while the present invention has been particularly shown and described with reference to example embodiments as illustrated in the drawing, it will be understood by one skilled in the art that various changes in detail may be affected therein without departing from the spirit and scope of the invention as defined by the claims.

What is claimed is:

1. A pixel circuit of an electronic display configured for operating in a drive mode or in one or more measurement modes, the pixel circuit comprising:
    a light emitting device (LED) configured to emit light responsive to an electrical drive current;
    a drive transistor comprising a first terminal, a second terminal, and a gate terminal, and configured to control the electrical drive current responsive to a voltage at the gate terminal thereof;
    a storage capacitor connected to the gate terminal of the drive transistor;
    a second transistor switchably connecting the gate terminal of the drive transistor to the second terminal thereof and for disconnecting said gate terminal of the drive transistor from the second terminal thereof during at least one of the one or more measurement modes;
    a first switching circuit switchably connecting the first terminal of the drive transistor to a power supply line of the electronic display or to a data line of the electronic display, the first switching circuit for connecting said first terminal of the drive transistor to the data line during said at least one of the one or more measurement modes; and,
    a second switching circuit switchably connecting one of the gate terminal of the drive transistor or the LED to a source of a reference voltage.

2. The pixel circuit of claim 1 wherein the LED comprises an organic light emitting diode (OLED), the OLED comprising an anode terminal for connecting to the drive transistor, and a cathode terminal for connecting to a negative power supply terminal.

3. The pixel circuit of claim 1 wherein the first switching circuit comprises a third transistor switchably connecting the first terminal of the drive transistor to the power supply line, and a fourth transistor switchably connecting the first terminal of the drive transistor to the data line.

4. The pixel circuit of claim 3 wherein the second switching circuit comprises a fifth transistor switchably connecting the gate terminal of the drive transistor to the source of a reference voltage for pre-charging the storage capacitor, and wherein the storage capacitor is connected between the gate terminal of the drive transistor and the power line.

5. The pixel circuit of claim 4 further comprising a sixth transistor switchably connecting the second terminal of the drive transistor to the LED.

6. The pixel circuit of claim 4 wherein the second switching circuit further comprises a seventh transistor switchably connecting the LED to the source of the reference voltage for pre-setting the LED.

7. The pixel circuit of claim 1 wherein the drive transistor, the second transistor, the first switching circuit, and the second switching circuit comprise each a p-type thin-film transistor.

8. A method for operating a pixel array of a display comprising a plurality of pixel circuits, each pixel circuit comprising a light emitting device (LED), a drive transistor comprising a gate, a first terminal, and a second terminal, and a storage capacitor connected to the gate, the method comprising:
    operating a pixel circuit of the pixel array in a drive mode comprising a programming stage and an emission stage,
    wherein the programming stage comprises temporally activating electrical connections between the second terminal of the drive transistor and the gate of the drive transistor and between the first terminal of the drive transistor and a data line of the display so as to charge the gate of the drive transistor with a data line voltage offset by a threshold voltage of the drive transistor; and, wherein the emission stage comprises temporally activating an electrical connection between the first terminal of the drive transistor and a power supply line while providing an electrical connection between the second terminal of the drive transistor and the LED so as to drive the LED with an electrical drive current responsive to the data line voltage; and, operating the pixel circuit in an LED measurement mode comprising a pre-charging stage and a measuring stage, wherein the pre-charging stage comprises applying a reference voltage to the gate of the drive transistor to shift the drive transistor into a triode mode wherein the drive transistor operates as a switch in an ON state; and wherein the measuring stage comprises:
at least temporally providing electrical connections between the second terminal of the drive transistor and the LED and between the first terminal of the drive transistor and the data line so as to enable an electrical current to flow between the data line and the LED; and,
measuring the electrical current in the data line.

9. The method of claim 8, further comprising:
operating the pixel circuit in a pixel measurement mode comprising:
temporally activating the electrical connections between the second terminal of the drive transistor and the gate of the drive transistor and between the first terminal of the drive transistor and the data line so as to pre-charge the gate of the drive transistor with the data line voltage offset by the threshold voltage of the drive transistor;
activating the electrical connections between the second terminal of the drive transistor and the LED and between the first terminal of the drive transistor and the data line so as to enable an electrical current to flow between the drive transistor and the data line; and
measuring the electrical current flowing in the data line while biasing the first terminal of the drive transistor with a pre-defined bias voltage through the data line.

10. The method of claim 9 further comprising activating the electrical connection between the LED and the source of a reference voltage after said measuring of the electrical current flowing in the data line during the pixel measurement mode.

11. The method of claim 8 wherein the pixel circuit is for operating a pixel in an i-th row or column of the pixel array, wherein i is an integer, the method comprising:
using a scan signal S[i] of the i-th row or column of the pixel array to activate or deactivate the electrical connection between the data line and the gate of the drive transistor,
using a programming signal SM[i] of the i-th row or column of the pixel array to activate or deactivate the electrical connection between the gate of the drive transistor and the second terminal of the drive transistor,
using an emission signal EM[i] of the i-the row or column of the pixel array to activate or deactivate the electrical connection between the second terminal of the drive transistor and the LED,
using an emission signal EM[i+1] of a next adjacent row or column of the pixel array to activate or deactivate the electrical connection between the first terminal of the drive transistor and the power supply line, using a scan signal S[i−1] of a preceding adjacent row or column of the pixel array to activate or deactivate an electrical connection between the gate of the drive transistor and a source of a reference voltage, and
using a scan signal S[i+1] of the next adjacent row or column of the pixel array to activate or deactivate an electrical connection between a LED terminal and the source of a reference voltage.

12. The method of claim 8 wherein operating the pixel circuit in the drive mode further comprises temporally activating an electrical connection between the gate of the drive transistor and the source of a reference voltage prior to the programming stage for pre-charging the storage capacitor.

13. The method of claim 8 further comprising at least temporally activating the electrical connection between the LED and the source of a reference voltage after the measuring stage of the LED measurement mode.

14. The method of claim 8 wherein the first terminal of the drive transistor is disconnected from the power supply line in the programming stage, and is disconnected from the data line in the emission stage, and wherein the first terminal of the drive transistor is disconnected from both the power supply line and the data line in the pre-charging stage.

15. A display apparatus adapted for taking pixel measurements during one or more measurement modes, comprising:
a pixel array comprising a plurality of pixel circuits, each pixel circuit comprising a light emitting device (LED), a drive transistor for providing electrical drive current to the LED, and a storage capacitor;
a source driver circuit comprising a source driver and a plurality of data lines connecting the source driver to the pixel circuits, wherein the source driver comprises a readout circuit (ROC) configured to measure an electrical current in the data lines;
a gate driver circuit comprising a gate driver and a plurality of control lines connecting the source driver to the pixel circuits;
a reference voltage circuit comprising a reference voltage source and a plurality of reference voltage lines connecting the reference voltage source to the pixel circuits;
a power supply circuit comprising a power supply source and a plurality of power supply lines for providing electrical power to the pixel circuits; and,
a controller operatively coupled to the source driver, the gate driver, and the reference voltage source, and configured for controlling electrical signals generated by the gate driver;
wherein the drive transistor of each pixel circuit comprises a first terminal, a second terminal, and a gate terminal, wherein the storage capacitor is connected to the gate terminal and one of the power supply lines; and,
wherein each pixel circuit further comprises a plurality of switching transistors, each of which controlled by a gate control signal from the gate driver, for controllably connecting:
the first terminal of the drive transistor to the power supply line or to one of the data lines,
the second terminal of the drive transistor to the gate of the drive transistor or to the LED, and
one of the reference voltage lines to the gate of the drive transistor or to the LED,
said plurality of switching transistors for controllably disconnecting said second terminal of the drive transistor from the gate of the drive transistor while connecting said first terminal of the drive transistor to said one of the data lines during at least one of the one or more measurement modes.

16. The display apparatus of claim 15 wherein the controller is configured to operate the pixel array in a drive mode wherein the source driver supplies data signals to the pixel circuits in synchronization with the gate control signals from the gate driver, and
wherein the controller is further configured to operate the pixel array in a LED measurement mode comprising a pre-charging stage and a measuring stage,
wherein in the pre-charging stage the reference voltage source provides a reference voltage to the gate of the drive transistor of a selected pixel circuit so that the drive transistor is shifted to a triode mode providing an electrical connection between the first terminal and the second terminal of the drive transistor, and
wherein in the measuring stage of the LED measurement mode the second terminal of the drive transistor is connected to the LED and the first terminal of the drive transistor is connected to the data line so as to provide a bias voltage to the LED from the data line and to allow an electrical current to flow between the ROC and the LED through the data line for being measured by the ROC.

17. The display apparatus of claim 15 wherein the controller is configured to operate the pixel array in a pixel measurement mode comprising a programming stage and a measuring stage, wherein:
in the programming stage the gate driver activates, for a selected pixel circuit, electrical connections between the second terminal of the drive transistor and the gate of the drive transistor and between the first terminal of the drive transistor and a data line so as to pre-charge the gate with a data line voltage offset by a threshold voltage of the drive transistor; and,
in the measuring stage the gate driver activates, for the selected pixel circuit, the electrical connections between the second terminal of the drive transistor and the LED and between the first terminal of the drive transistor and the data line so as to enable an electrical current to flow between the data line and the LED, and the ROC measures the electrical current flowing in the data line while biasing the first terminal of the drive transistor with a pre-defined bias voltage through the data line.

18. The display apparatus of claim 15 wherein the pixel array comprises a plurality of pixel rows, and wherein the plurality of control lines comprises:
a plurality of scan lines for delivering scan signals S[i] to the pixel circuits of each pixel row,
a plurality of programming control lines for delivering programming signals SM[i] to the pixel circuits of each pixel row, and
a plurality of emission control lines for delivering emission signals EM[i] to the pixel circuits of each pixel row.

19. The display apparatus of claim 18 wherein at least some of the scan lines are connected to three adjacent pixel rows each, and wherein at least some of the emission control lines are connected to two adjacent pixel rows each.

20. The display apparatus of claim 16 wherein the controller is configured to control the source of a reference voltage so as to provide to the pixel circuit a first reference voltage in the drive mode and a second reference voltage in the LED measurement mode.

* * * * *